United States Patent
Lee et al.

(10) Patent No.: US 10,511,327 B2
(45) Date of Patent: Dec. 17, 2019

(54) APPARATUS AND METHOD FOR DECODING LDPC CODE

(71) Applicants: Samsung Electronics Co., Ltd., Suwon-si, Gyeonggi-do (KR); Korea University Research and Business Foundation, Seoul (KR)

(72) Inventors: Myeong-Woo Lee, Hwaseong-si (KR); Tae Hyun Kim, Seoul (KR); Jong Hyun Baik, Seongnam-si (KR); Jun Heo, Seoul (KR)

(73) Assignees: Samsung Electronics Co., Ltd., Suwon-si (KR); Korea University Research and Business Foundation, Seoul (KR)

( * ) Notice: Subject to any disclaimer, the term of this patent is extended or adjusted under 35 U.S.C. 154(b) by 58 days.

(21) Appl. No.: 15/667,465

(22) Filed: Aug. 2, 2017

(65) Prior Publication Data
US 2018/0041227 A1    Feb. 8, 2018

(30) Foreign Application Priority Data
Aug. 2, 2016   (KR) .................. 10-2016-0098563

(51) Int. Cl.
*H03M 13/11*   (2006.01)
*H03M 13/29*   (2006.01)
*H03M 13/00*   (2006.01)

(52) U.S. Cl.
CPC ...... *H03M 13/1125* (2013.01); *H03M 13/114* (2013.01); *H03M 13/1117* (2013.01);
(Continued)

(58) Field of Classification Search
CPC .................................................. H03M 13/11
(Continued)

(56) References Cited

U.S. PATENT DOCUMENTS 8,656,247 B2 * 2/2014 Kyung ............... H03M 13/1111
                                                                714/758
8,862,970 B1   10/2014 Varnica et al.
(Continued)

FOREIGN PATENT DOCUMENTS

KR    1020150121966 A    10/2015
WO       2008075337 A1     6/2008

*Primary Examiner* — Fritz Alphonse

(57) ABSTRACT

The present disclosure relates to a pre-$5^{th}$-Generation (5G) or 5G communication system to be provided for supporting higher data rates Beyond $4^{th}$-Generation (4G) communication system such as Long Term Evolution (LTE). Disclosed is an apparatus for performing an iteration decoding scheme for a Low Density Parity Check (LDPC) code. The apparatus includes a receiver configured to receive an encoded signal based on a parity matrix set for a plurality of variable nodes including a first variable node with a first degree and a second variable node with a second degree. The apparatus further includes a processor configured to determine at least one variable node based on a first threshold determined according to the first degree and a second threshold determined according to the second degree among the plurality of variable nodes and to generate decoded data from the signal based on the at least one determined variable node.

20 Claims, 13 Drawing Sheets

(52) U.S. Cl.
CPC ..... *H03M 13/2948* (2013.01); *H03M 13/616* (2013.01); *H03M 13/6502* (2013.01)

(58) Field of Classification Search
USPC .................................. 714/758, 761, 756
See application file for complete search history.

(56) References Cited

U.S. PATENT DOCUMENTS

| | | | |
|---|---|---|---|
| 9,503,124 | B2 | 11/2016 | Sunwoo et al. |
| 10,078,540 | B2* | 9/2018 | Bisplinghoff ......... G06F 11/076 |
| 2005/0283708 | A1* | 12/2005 | Kyung ............... H03M 13/1111 |
| | | | 714/758 |
| 2008/0195898 | A1 | 8/2008 | Savin |
| 2011/0126075 | A1* | 5/2011 | Gunnam ............ H03M 13/1111 |
| | | | 714/752 |
| 2013/0007557 | A1* | 1/2013 | Yen ..................... H03M 13/015 |
| | | | 714/755 |
| 2015/0026541 | A1* | 1/2015 | Zhang ............... H03M 13/1111 |
| | | | 714/776 |
| 2017/0264316 | A1* | 9/2017 | Lee .......................... H04L 1/20 |

* cited by examiner

APPARATUS AND METHOD FOR DECODING LDPC CODE

CROSS-REFERENCE TO RELATED APPLICATION AND CLAIM OF PRIORITY

This application is related to and claims priority to Korean Application Serial No. 10-2016-0098563 filed on Aug. 2, 2016, the contents of which are incorporated herein by reference.

TECHNICAL FIELD

The present disclosure relates to decoding, and more particularly to an apparatus and a method for decoding a Low Density Parity Check (LDPC) code.

BACKGROUND

To meet the demand for wireless data traffic having increased since deployment of $4^{th}$ generation (4G) communication systems, efforts have been made to develop an improved $5^{th}$ generation (5G) or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

With the development of communication technology, there is a need for a channel coding method that can acquire higher efficiency. In order to satisfy this need, a Low Density Parity Check (LDPC) has appeared as a new alternative. However, decoding using an LDPC code requires a relatively large amount of calculations. Accordingly, a method of reducing the amount of calculations in the decoding using the LDPC code is needed.

SUMMARY

To address the above-discussed deficiencies, it is a primary object to provide an apparatus and a method for performing a structural decoding scheme that reduces an amount of decoding calculations.

In accordance with an aspect of the present disclosure, a method of operating an apparatus for performing an iteration decoding scheme for a Low Density Parity Check (LDPC) code is provided. The method includes: receiving an encoded signal based on a parity matrix set for a plurality of variable nodes including a first variable node with a first degree and a second variable node with a second degree; determining at least one variable node based on a first threshold determined according to the first degree and a second threshold determined according to the second degree among the plurality of variable nodes; and generating decoded data from the signal based on the at least one determined variable node.

In accordance with another aspect of the present disclosure, an apparatus for performing an iteration decoding scheme for a Low Density Parity Check (LDPC) code is provided. The apparatus includes: a receiver configured to receive an encoded signal based on a parity matrix set for a plurality of variable nodes including a first variable node with a first degree and a second variable node with a second degree; and a processor configured to determine at least one variable node based on a first threshold determined according to the first degree and a second threshold determined according to the second degree among the plurality of variable nodes and to generate decoded data from the signal based on the at least one determined variable node.

An apparatus and a method according to various embodiments of the present disclosure can reflect a structure of a parity matrix in decoding of a Low Density Parity Check (LDPC) code, thereby reducing an amount of calculations.

Effects which can be acquired by the present disclosure are not limited to the above described effects, and other effects that have not been mentioned may be clearly understood by those skilled in the art from the following description.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
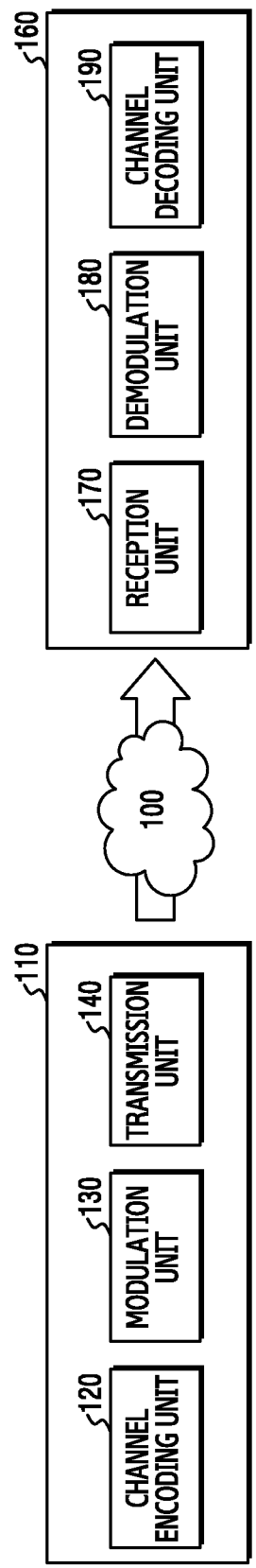
FIG. 1 is a block diagram illustrating a transmission device and a reception device according to various embodiments of the present disclosure.

FIGS. 1 through 10D, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The terms used in the present disclosure are only used to describe specific embodiments, and are not intended to limit the present disclosure. A singular expression may include a plural expression unless they are definitely different in a context. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

Hereinafter, in various embodiments of the present disclosure, hardware approaches will be described as an example. However, various embodiments of the present disclosure include a technology that uses both hardware and software and thus, the various embodiments of the present disclosure may not exclude the perspective of software.

Hereinafter, various embodiments of the present disclosure will be described with reference to the accompanying drawings. The embodiments and the terms used therein are not intended to limit the technology disclosed herein to specific forms, and should be understood to include various modifications, equivalents, and/or alternatives to the corresponding embodiments. In describing the drawings, similar reference numerals may be used to designate similar constituent elements. A singular expression may include a plural expression unless they are definitely different in a context.

As used herein, singular forms may include plural forms as well unless the context clearly indicates otherwise. The expression "a first", "a second", "the first", or "the second" used in various embodiments of the present disclosure may modify various components regardless of the order and/or the importance but does not limit the corresponding components. When an element (e.g., first element) is referred to as being "(functionally or communicatively) connected," or "directly coupled" to another element (second element), the element may be connected directly to the another element or connected to the another element through yet another element (e.g., third element).

The expression "configured to" as used in various embodiments of the present disclosure may be interchangeably used with, for example, "suitable for", "having the capacity to", "designed to", "adapted to", "made to", or "capable of" in terms of hardware or software, according to circumstances. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

FIG. 1 is a block diagram illustrating a transmission device and a reception device according to various embodiments of the present disclosure. The term " . . . unit" or the ending of a word, such as " . . . or", " . . . er", or the like may indicate a unit of processing at least one function or operation, and this may be embodied by hardware, software, or a combination of hardware and software.

Hereinafter, terms required for describing various embodiments will be defined in FIG. 1. The terms referring to control information used in the following description, terms for calculation states (for example, a node and an operation), terms referring to data (for example, a codeword, an information word, a bit sequence), terms referring to network entities, terms referring to messages (for example, a packet and a signal), and terms referring to elements of the device are employed for convenience of description. Accordingly, the present disclosure is not limited to the following terms and other terms having the same technical meaning may be used.

Referring to FIG. 1, the transmission device may be a transmission device 110. The transmission device 110 may include a channel encoding unit 120, a modulation unit 130, and a transmission unit 140. The reception device may be a reception device 160. The reception device 160 may include a reception unit 170, a demodulation unit 180, and a channel decoding unit 190. The transmission device 110 may transmit a signal to the reception device 160.

When the transmission device 110 transmits the signal, a transmission error may be generated due to an effect of noise of a channel through which the signal is transmitted, an attenuation phenomenon occurring according to a transmission distance, and a distortion phenomenon according to a transmission delay. When the error is generated, the reception device 160 may be used to perform an error control. That is, the reception device 160 may be used to perform error detection or error correction. The transmission device 110 may perform a channel coding to make the reception device 160 perform the error detection or the error control. In other words, in order to transmit an information word to the reception device 160, the transmission device 110 may perform a channel coding for the information word. The information word may be a bit sequence in which a source coding is performed.

The channel encoding unit 120 may generate a codeword for the information word through the channel coding. The channel encoding unit 120 may generate the codeword through the channel coding using a Low Density Parity Check (LDPC) code. For example, the information word may be a bit sequence having k bits. The channel encoding unit 120 may generate a codeword of n bits by adding at least one parity bit to the information word of k bits. The number of at least one parity bit may be n−k. Specifically, the channel encoding unit 120 may generate the codeword based on Equation (1) below.

$$m \times G = c \qquad \text{Equation (1)}$$

m denotes an information matrix for an information word, and c denotes a code matrix for a codeword. G denotes a generation matrix for generating the codeword from the information word. The information matrix may be a matrix having 1×n dimensions. The code matrix may be a matrix having 1×k dimensions. The generation matrix may be a matrix having n×k dimensions.

The channel encoding unit 120 may provide (or transmit) the generated codeword to the modulation unit 130.

The modulation unit 130 may perform modulation on the generated codeword. The modulation unit 130 may modulate the generated codeword through various modulation schemes. For example, the modulation unit 130 may perform the modulation on the generated codeword in a Binary Phase Shift Keying (BPSK) type and perform symbol mapping. In another example, the modulation unit 130 may perform the modulation on the generated codeword in a 16 Quadrature Amplitude Modulation (QAM) type and perform symbol mapping. The modulation unit 130 may module the codeword to generate a signal. The modulation unit 130 may transmit the generated signal to the transmission unit 140.

The transmission unit 140 may transmit the signal to the reception device 160 through a channel 100 between the transmission unit 140 and the reception device 160. The transmission unit 140 may up-convert the signal from a baseband signal to an RF band signal and transmit the up-converted signal through an antenna.

The channel 100 may be a channel including noise. For example, the channel 100 may be an Additive White Gaussian Noise (AWGN) channel. The AWGN channel corresponds to a channel of which a power spectrum density of a noise signal has a Gaussian distribution in a frequency band. In another example, the channel 100 may be a fading channel. The fading channel corresponds to a channel in which an amplitude and a phase of the signal transmitted according to a multipath irregularly change.

The reception unit 170 may receive the signal from the transmission device 110 through the channel 100. The reception unit 170 may down-convert the signal received through the antenna from the RF band signal to the baseband signal. The reception unit 170 may transmit the down-converted signal to the demodulation unit 180.

The demodulation unit 180 may demodulate the signal to generate a bit sequence. The demodulation unit 180 may demodulate the signal according to the scheme of the modulation by the modulation unit 130. For example, when the modulation unit 130 uses a BPSK scheme, the demodulation unit 180 may demodulate the signal based on the BPSK scheme. The demodulation unit 180 may transmit the generated bit sequence to the channel decoding unit 190.

The channel decoding unit 190 may decode the bit sequence. The channel decoding unit 190 may decode the bit sequence according to the scheme of the channel coding used by the channel encoding unit 120. For example, when the channel encoding unit 120 performs the encoding by using the LDPC code, the channel decoding unit 190 may decode the bit sequence by using the LDPC code. The channel decoding unit 190 may decode the bit sequence by using a parity matrix H stored in the reception device 160. The bit sequence may be a bit sequence having n bits.

The channel decoding unit 190 may determine whether the decoded bit sequence meets Equation (2) below. Equation (2) below may be referred to as a decoding success condition.

$$H \times c^T = 0 \qquad \text{Equation (2)}$$

H denotes a parity matrix, and c denotes a code matrix for a decoded bit sequence. The parity matrix may be a matrix having (n−k)×n dimensions. The code matrix may be a matrix having 1×n dimensions.

When the decoded bit sequence does not meet Equation (2), the channel decoding unit 190 may determine again whether a value of each of the bits within the bit sequence is 0 or 1 based on a likelihood value of each of the bits within the bit sequence. For example, the channel decoding unit 190 may determine again the value of each of the bits within the bit sequence by using a Sum Product Algorithm (SPA) and a Belief Propagation Algorithm (BPA).

When the bit sequence meets Equation (2) below, the channel decoding unit 190 may determine that the decoding is successful. When it is determined that the decoding is successful, the channel decoding unit 190 may determine the finally decoded bit sequence as the codeword. The channel decoding unit 190 may detect the information word based on the codeword. The information word may include information bits which the transmission device 110 desires to transmit to the reception device 160.

In order to successfully decode the bit sequence, the channel decoding unit 190 may repeatedly perform an operation of determining whether the value of each of the bits within the bit sequence of the codeword is 0 or 1. The iteration operation may cause power consumption of the channel decoding unit 190. Accordingly, a method of reducing an amount of calculations of the channel decoding unit 190 is useful.

Figure 2:
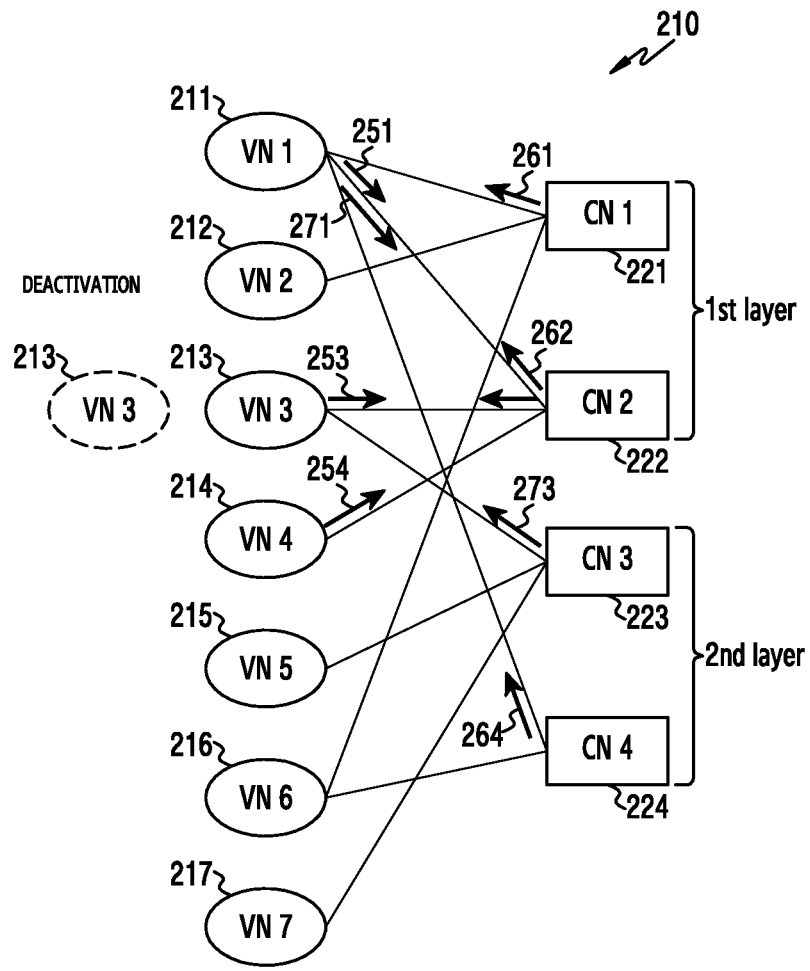
FIG. 2 illustrates an example of deactivation of a Variable Node (VN) of a channel decoding unit according to various embodiments of the present disclosure.

FIG. 2 illustrates an example of deactivation of a Variable Node (VN) of the channel decoding unit according to various embodiments of the present disclosure. The channel decoding unit may be the channel decoding unit 190 of FIG. 1. In the present disclosure, the deactivated node (variable node or check node) may not update a likelihood value to be transmitted from the corresponding node to another node. A detailed definition of the likelihood value updated by the node will be made below.

Hereinafter, the present disclosure describes a decoding operation of the LDCP code. Specifically, the present disclosure describes a decoding operation for the LDCP code using a Layered Belief Propagation (LBP) scheme. The LDPC code may be a Quasi Cycle (QC)-LDPC code having a parity matrix of a regular structure. In order to describe a decoding scheme of the LDPC code, a Tanner graph may be referred to. The Tanner graph corresponds to a graph showing a structure of the parity matrix of the LDPC code.

Hereinafter, for convenience of description, a decoding operation of a codeword of 7 bits including an information word of 3 bits and parity bits of 4 bits will be described as an example, but the present disclosure is not limited thereto. In order to detect the codeword, a parity matrix having a dimension of 4×7 may be used. The parity matrix may be a parity matrix 200 of FIG. 2. That is, the parity matrix may be set as the following equation.

$$H = \begin{pmatrix} 1 & 1 & 0 & 0 & 0 & 1 & 0 \\ 1 & 0 & 1 & 1 & 0 & 0 & 0 \\ 0 & 0 & 1 & 0 & 1 & 0 & 1 \\ 1 & 0 & 0 & 0 & 0 & 1 & 0 \end{pmatrix}$$ Equation (3)

Referring to FIG. 2, the Tanner graph 210 includes 7 variable nodes 211, 212, 213, 214, 215, 216, and 217. The Tanner graph 210 includes 4 check nodes 222, 222, 223, and 224. Rows of the parity matrix correspond to check nodes included in the Tanner graph 210, respectively. Rows of the parity matrix correspond to check nodes included in the Tanner graph 210, respectively. That is, the parity matrix 200 may have 4 check nodes and 7 variable nodes.

The variable nodes correspond to bits of the input bit sequence, respectively. The input bit sequence may be the codeword transmitted by the transmission device 110 of FIG. 1. For example, the variable node 211 may correspond to a first bit value of the transmitted codeword. The reception device 160 may determine the first bit value based on a likelihood value of the variable node 211 through a decoding operation of the LDPC code described below. The likelihood value may be an APP LLR value described below.

Elements of the parity matrix indicate connection states between the variable nodes 211 to 217 and the check nodes 221 to 224 included in the Tanner graph 210, respectively. For example, when a component in a second row and a third column of the parity matrix 200 is 1, it indicates that a second Check Node (CN) and a third variable node are connected to each other. In another example, when the component in the third row and the second column of the parity matrix 200 is 0, it indicates the third check node and the second variable node 212 are not connected to each other. A line that connects a predetermined check node and a predetermined viable node may be referred to as an edge.

A structure of the parity matrix is determined according to a degree of each variable node. The degree of the node may be determined according to the number of edges connected to the node. For example, the variable node 213 corresponding to the third variable node is connected to two edges, and thus the degree of the variable node 213 is two. In another example, the variable node 217 is connected to one edge, and thus the degree of the variable node 217 is one.

Calculations of the parity matrix may be performed in the unit of layers. In the parity matrix, one row corresponds to one check node. In other words, when the number of rows of the parity matrix is large, an amount of calculations may increase. Accordingly, in order to reduce the amount of decoding calculations, the channel decoding unit 190 may perform the calculations in the unit of layers in the decoding operation. The layers may include at least one check node. The layers may be the unit of dividing rows of the parity matrix. For example, the parity matrix 200 may have two layers. First and second rows of the parity matrix 200 may be divided as a first layer, and third and fourth rows of the parity matrix 200 may be divided as a second layer.

The channel decoding unit 190 may decode the input bit sequence based on the plurality of variable nodes and the plurality of check nodes.

Based on the LBP decoding scheme, the channel decoding unit 190 may decode the input bit sequence in the unit of layers. For example, the channel decoding unit 190 may decode the bit sequence based on first check nodes included in the first layer and first variable nodes connected to the check nodes included in the first layer. When the decoded bit sequence does not meet the decoding success condition of Equation (2), the channel decoding unit 190 may decode the bit sequence for the second layer again. In such a way, the channel decoding unit 190 may decode the bit sequence for all layers. When the decoded bit sequence does not meet the condition of Equation (2) on the last layer, the channel decoding unit 190 may decode the bit sequence for the first layer again.

The channel decoding unit 190 may update likelihood values for the bit sequence whenever the decoding operation is repeated. The likelihood value may be an A Posteriori Probability (APP) Log Likelihood Ratio (LLR) value. An APP LLR value of the bit included in the bit sequence may be a likelihood value indicating whether the bit is 0 or 1. The channel decoding unit 190 may acquire more accurate LLR values by updating the likelihood values. The channel decoding unit 190 may increase the decoding success rate by acquiring the more accurate LLR values.

Before performing the decoding on the input bit sequence, the channel decoding unit 190 may initialize settings of the plurality of variable nodes and the plurality of check nodes.

The channel decoding unit 190 may initialize check node calculation values in the plurality of check nodes. The check node calculation value may indicate the likelihood value (for example, a Log Likelihood Ratio (LLR)) which a predetermined check node transmits to a predetermined variable node. For example, the check node calculation value in an $m^{th}$ check node may indicate an LLR value transmitted to a predetermined variable node connected to the $m^{th}$ check node. The channel decoding unit 190 may set all initial values of the check node calculation values to be 0.

The channel decoding unit 190 may initialize variable node calculation values in the plurality of variable nodes. The variable node calculation value may indicate the likelihood value which a predetermined variable node transmits to a predetermined check node. For example, an $n^{th}$ variable node among the plurality of variable nodes may initialize an LLR value transmitted to a predetermined check node connected to the $n^{th}$ variable node. In some embodiments, the channel decoding unit 190 may set the variable node calculation values in the plurality of variable nodes to be 0. In other embodiments, the channel decoding unit 190 may set initial values of the APP LLR values described below to be the initial values of the plurality of variable node calculation values.

The channel decoding unit 190 may initialize the likelihood value of each of the plurality of variable nodes. The likelihood value may be the APP LLR value. As described above, the APP LLR value may be the likelihood value indicating whether the bit value of the bit sequence corresponding to each of the plurality of variable nodes is 0 or 1. For example, when the APP LLR value of the third bit in the bit sequence is 3.2, the channel decoding unit 190 may determine that the value of the third bit is 1. In another example, when the APP LLR value of the fifth bit in the bit sequence is −2.2, the channel decoding unit 190 may determine that the value of the fifth bit is 0. The channel decoding unit 190 may determine the APP LLR value of each of the plurality of variable nodes based on a value of a received signal and a noise value included in a channel of the signal. For example, when a signal modulated in the BPSK type is received, the channel decoding unit 190 may set the initial value of the APP LLR value according to Equation (4) below.

$$U_{n,ch}^{(0)} = \frac{2y_n}{\sigma^2} \qquad \text{Equation (4)}$$

$U_{n,ch}^{(0)}$ denotes an initial value of the APP LLR value transmitted to an $n^{th}$ variable node. $y_n$ denotes a message value corresponding to bits of the $n^{th}$ variable node, and $\sigma$ denotes variance of noise in a channel (CH).

Hereinafter, in an $i^{th}$ iteration decoding operation, a calculation operation in a $k^{th}$ layer will be described. For convenience of description, in the $i^{th}$ iteration decoding operation, a check node calculation value transmitted from the $m^{th}$ check node to the $n^{th}$ variable node may be expressed as $U_{mn}^{(i)}$. In the $i^{th}$ iteration decoding operation, a variable node calculation value transmitted from the $n^{th}$ variable node to the $m^{th}$ check node may be expressed as $V_{mn}^{(i)}$. In the $i^{th}$ iteration decoding operation, a likelihood value in the $n^{th}$ variable node may be expressed as $\beta_n^{(i)}$.

The channel decoding unit 190 may update the check node calculation values in the check nodes included in the $k^{th}$ layer. The $k^{th}$ layer may include the $m^{th}$ check node. The channel decoding unit 190 may update the check node calculation values based on the following equation. The $n^{th}$ variable node may be a predetermined variable node connected to the $m^{th}$ check node.

$$U_{mn}^{(i)} = \Pi_{n' \in N(m) \setminus n} sgn(V_{mn'}^{(i-1)}) \min_{n' \in N(m) \setminus n} |V_{mn'}^{(i-1)}| \qquad \text{Equation (5)}$$

$U_{mn}^{(i)}$ denotes a check node calculation value transmitted from the $m^{th}$ check node to the $n^{th}$ variable node in the $i^{th}$ iteration decoding operation. The check node calculation value is the LLR value. $N(m)$ denotes a set of variable nodes connected to the $m^{th}$ check node.

For example, the channel decoding unit 190 may determine $U_{21}^{(i)}$ corresponding to a check node calculation value 262 as a calculation value in the check node 222. For the check node calculation, the channel decoding unit 190 may acquire a variable node calculation value 251, a variable node calculation value 253, and a variable node calculation value 254. At this time, the variable node calculation value 253 and the variable node calculation value 254 correspond to variable node calculation values updated in an $i-1^{th}$ iteration decoding operation. The channel decoding unit 190 may determine the check node calculation value 262 by using a smaller value between the variable node calculation value 253 and the variable node calculation value 254 based on Equation (5) above.

In determining the check node calculation values, the channel decoding unit 190 may simultaneously perform a plurality of calculations. For example, when the iteration decoding operation of the first layer is being performed, the channel decoding unit 190 may update check node calculation values in the check node 221 and the check node 222 in parallel.

In some embodiments, when the check node calculation values are updated in parallel, the channel decoding unit 190 may use a second minimum algorithm in order to reduce an amount of calculations. For example, in order to update the check node calculation value 262, the channel decoding unit 190 may acquire the check node calculation value 251 as well as the variable node calculation value 253 and the check node calculation value 254. That is, the channel decoding unit 190 may acquire variable node calculation values from all variable nodes connected to the corresponding check node. The channel decoding unit 190 may determine a first variable node calculation value having the smallest size and a second variable node calculation value having a second smallest size among the variable node calculation values. Thereafter, the channel decoding unit 190 identifies the connected variable node 211 in order to update the check node calculation value 262. When the first variable node calculation value is not acquired from the variable node 211, the channel decoding unit 190 may use the first variable node calculation value in updating the check node calculation value 262 based on Equation (5) above. However, when the first variable node calculation value is acquired from the variable node 211, the channel decoding unit 190 may use the second variable node calculation value in updating the check node calculation value 262 based on Equation (5) above. At this time, when updating another check node calculation value of the check node 222, the channel decoding unit 190 may use the first variable node calculation value.

As described above, when updating a plurality of check node calculation values in one check node, the channel decoding unit 190 may reduce the number of calculations through the second minimum algorithm. Also, when determining whether to deactivate the check node and whether to re-activate the variable node, the channel decoding unit 190 may reduce the number of calculations through the second minimum algorithm.

The channel decoding unit 190 may update the variable node calculation values in the variable nodes corresponding to the $k^{th}$ layer. The variable nodes may be variable nodes connected to check nodes included in the $k^{th}$ layer through at least one edge. The variable nodes may include the $n^{th}$ variable node. The check nodes included in the $k^{th}$ layer may include the $m^{th}$ check node. The channel decoding unit 190 may update the variable node calculation values based on the following equation.

$$V_{mn}^{(i)} = U_{n,ch}^{(0)} + \sum_{m' \in M(n) \setminus m} U_{m'n}^{(i)} \qquad \text{Equation (6)}$$

$V_{mn}^{(i)}$ denotes a variable node calculation value transmitted from the $n^{th}$ variable node to the $m^{th}$ check node in the $i^{th}$ iteration decoding operation. The variable node calculation value is an LLR value. M(n) denotes a set of check nodes connected to the $n^{th}$ variable node.

For example, the channel decoding unit 190 may determine $V_{21}^{(i)}$ of the variable node calculation value 271 as the variable node calculation value of the variable node 211. The channel decoding unit 190 may update $V_{21}^{(i-1)}$ of the i-1$^{th}$ variable node calculation value 251 to be $V_{21}^{(i)}$ of the it variable node calculation value 271 in the $i^{th}$ iteration decoding operation. In order to update variable node calculation values, the channel decoding unit 190 may acquire the check node calculation value 261, the check node calculation value 262, and the check node calculation value 264. At this time, the check node calculation value 261, the check node calculation value 262, and the check node calculation value 264 correspond to check node calculation values updated during the $i^{th}$ iteration decoding operation. The channel decoding unit 190 may determine the variable node calculation value 271 by using the check node calculation value 261 and the check node calculation value 264 based on Equation (6) above.

When determining variable node calculation values, the channel decoding unit 190 may simultaneously perform a plurality of calculations. For example, when the iteration decoding operation of the first layer is being performed, the channel decoding unit 190 may update variable node calculation values in parallel in the variable nodes 211, 212, 213, 214, and 216 connected to the check node 221 and the check node 222.

The channel decoding unit 190 may update a likelihood value of each of the plurality of variable nodes in the parity matrix based on the updated variable node calculation values and check node calculation values. The channel decoding unit 190 may update the likelihood value of each of the plurality of variable nodes based on the following equation. The likelihood value may be the APP LLR value.

$$\beta_n^{(i)} = U_{n,ch}^{(0)} + \Sigma_{m \in M(n)} U_{mn}^{(i)} \qquad \text{Equation (7)}$$

$\beta_n^{(i)}$ denotes a likelihood value in the $n^{th}$ variable node during the $i^{th}$ iteration decoding operation. M(n) denotes a set of check nodes connected to the $n^{th}$ variable node. The channel decoding unit 190 may update likelihood values in all the plurality of nodes without a distinction of layers.

According to various embodiments of the present disclosure, the channel decoding unit 190 may determine a deactivation variable node to be deactivated among the plurality of variable nodes in order to reduce an amount of calculations. The channel decoding unit 190 may determine the deactivation variable node based on the likelihood value. The likelihood value may be the APP LLR value. More specifically, the channel decoding unit 190 may determine the deactivation variable node based on the following equation.

$$|\beta_n^{(i)}| = |U_{n,ch}^{(0)} + \Sigma_{m \in M(n)} U_{mn}^{(i)}| \geq t_v^{deg(n)} \qquad \text{Equation (8)}$$

$\beta_n^{(i)}$ denotes a likelihood value in the $n^{th}$ variable node during the $i^{th}$ iteration decoding operation. $U_{n,ch}^{(0)}$ denotes an initial value of the likelihood value of the $n^{th}$ variable node. M(n) denotes a set of check nodes connected to the $n^{th}$ variable node. $t_v^{deg(n)}$ denotes a Variable Node (VN) threshold determined according to a degree of the $n^{th}$ variable node.

The channel decoding unit 190 may determine at least one variable node that meets Equation (8) above among the plurality of variable nodes. The channel decoding unit 190 may insert at least one variable node into a deactivation set. With respect to the deactivation variable node included in the deactivation set, the channel decoding unit 190 may not update the variable node calculation value of the corresponding variable node from a next decoding operation. That is, the channel decoding unit 190 may set an i+1$^{th}$ variable node calculation value to be the same as the $i^{th}$ variable node calculation value. The channel decoding unit 190 may omit the calculation process for the i+1$^{th}$ variable node calculation value.

For example, the channel decoding unit 190 may determine $\beta_3^{(i)}$ as the APP LLR value of the variable node 213. The channel decoding unit 190 may determine the APP LLR value of the variable node 213 by using the node calculation value 272 and the check node calculation value 273 based on Equation (8). The channel decoding unit 190 may determine whether to deactivate the variable node 213 by comparing the APP LLR value of the variable node 213 and $t_v^{deg(3)}$. More specifically, the channel decoding unit 190 may acquire information indicating a variable node threshold from the memory. The variable node 213 is connected to two edges and thus may have a second degree. That is, the channel decoding unit 190 may acquire information indicating a variable node threshold for the second degree from the memory. The channel decoding unit 190 may determine whether to deactivate the variable node 213 by comparing the variable node threshold for the second degree and the APP LLR value of the variable node 213. When determining to deactivate the variable node 213, the channel decoding unit 190 may insert the variable node 213 into the deactivation set. The variable node calculation value in the variable node 213 is not updated in a next iteration operation.

In another example, the channel decoding unit 190 may determine $\beta_1^{(i)}$ as the APP LLR value of the variable node 211. The channel decoding unit 190 may determine whether to deactivate the variable node 211 by comparing the APP LLR value of the variable node 211 and $t_v^{deg(1)}$. The variable node 211 has a degree corresponding to a tertiary degree, and the channel decoding unit 190 may acquire information indicating a variable node threshold for the tertiary degree. The channel decoding unit 190 may determine whether to deactivate the variable node 211 by comparing the variable node threshold for the tertiary degree and the APP LLR value of the variable node 211. When it is determined to not deactivate the variable node 211, the channel decoding unit 190 may not insert the variable node 211 into the deactivation set. The variable node calculation value in the variable node 211 may be updated in a next iteration operation.

The channel decoding unit 190 may omit the calculation for updating the variable node calculation value by deactivating the variable node. The channel decoding unit 190 may reflect a structure of the applied LDPC code by applying different thresholds to variable nodes with different degrees among the plurality of variable nodes. While the case where, as the same threshold is applied to all variable nodes, no effect for reducing the amount of calculations for a variable node with a relatively low degree is acquired, the channel decoding unit 190 according to various embodiments may acquire an effect for optimally reducing the amount of calculations in the decoding operation by reflecting the structure of the applied LDPC code.

Figure 3:
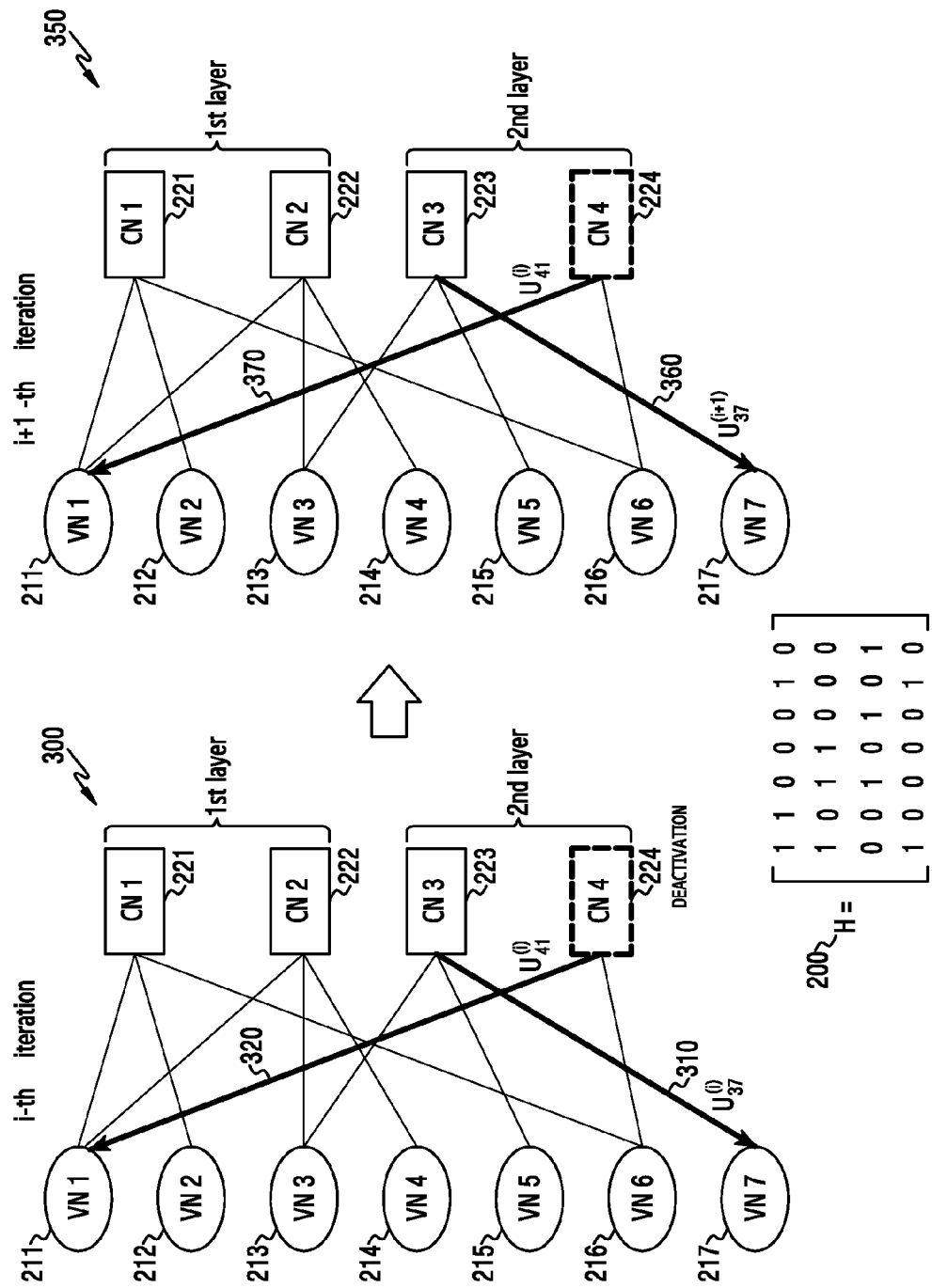
FIG. 3 illustrates an example of deactivation of a Check Node (CN) of the channel decoding unit according to various embodiments of the present disclosure.

FIG. 3 illustrates an example of deactivation of check nodes of a channel decoding unit according to various embodiments of the present disclosure. The channel decoding unit may be the channel decoding unit 190 of FIG. 1. Hereinafter, a situation in which the channel decoding unit 190 updates check node calculation values on a second layer during an $i^{th}$ iteration decoding operation will be described.

Referring to FIG. 3, the channel decoding unit 190 may perform the decoding by using the parity matrix 200 of FIG. 2. Accordingly, the channel decoding unit 190 may perform a decoding operation of a codeword of 7 bits consisting of an information word of 3 bits and parity bits of 4 bits through a Tanner graph 300 and a Tanner graph 350.

The channel decoding unit 190 may update check node calculation values of check nodes included in a second layer during the $i^{th}$ iteration decoding operation. More specifically, the channel decoding unit 190 may update the check node calculation values based on Equation (5) above. For example, the channel decoding unit 190 may acquire variable node calculation values $V_{33}^{(i-1)}$, $V_{35}^{(i-1)}$, $V_{37}^{(i-1)}$ from variable nodes 213, 215, and 217 connected to the check node 223 included in the second layer. The channel decoding unit 190 may acquire variable node calculation values $V_{41}^{(i-1)}$, $V_{46}^{(i-1)}$ from variable nodes 211 and 216 connected to the check node 224 included in the second layer. The channel decoding unit 190 may update check node calculation values $U_{33}^{(i)}$, $U_{35}^{(i)}$, $U_{37}^{(i)}$ of the check node 223 and check node calculation values $U_{41}^{(i)}$, $U_{46}^{(i)}$ of the check node 224 based on the acquired variable node calculation values.

According to various embodiments of the present disclosure, the channel decoding unit 190 may determine a check node to be deactivated. In order to determine the check node to be deactivated, the channel decoding unit 190 may determine whether two conditions are satisfied. The channel decoding unit 190 may determine a check node that meets all two conditions among a plurality of check nodes.

The channel decoding unit 190 may determine whether a first condition between the two conditions is satisfied. In order to update check node calculation values included in a $k^{th}$ layer, the channel decoding unit 190 may acquire variable node calculation values. The channel decoding unit 190 may determine whether the first condition is satisfied based on the acquired variable node calculation values. More specifically, the channel decoding unit 190 may determine whether the first condition is satisfied based on the following equation.

$$\min_{n' \in N(m)} |V_{mn'}^{(i-1)}| > T_c^{(k)} \quad \text{Equation (9)}$$

$V_{mn'}^{(i-1)}$ denotes a variable node calculation value transmitted from the $n^{th}$ variable node to the $m^{th}$ check node during the $i-1^{th}$ iteration decoding operation. The $m^{th}$ check node is a check node included in the $k^{th}$ layer. The variable node calculation value is an LLR value. N(m) denotes a set of variable nodes connected to the $m^{th}$ check node. $T_c^{(k)}$ denotes a Check Node (CN) threshold applied to the $k^{th}$ layer.

When Equation (9) above is satisfied, the channel decoding unit 190 may determine that the first condition is met. The channel decoding unit 190 may store indication information indicating whether the first condition is met. The channel decoding unit 190 may determine whether a second condition described below is met based on the indication information. For example, when the first condition is met, the channel decoding unit 190 may determine whether the second condition is met. In another example, when the first condition is not met, the channel decoding unit 190 may not determine whether the second condition is met.

In some embodiments, the channel decoding unit 190 may determine the check node to be deactivated based on a result of the second minimum algorithm used when the check node calculation value is updated. The channel decoding unit 190 may use a first variable node calculation value with the smallest size among the variable node calculation values acquired to update the check node calculation value. The channel decoding unit 190 may determine whether the first condition is met by comparing the first variable node calculation value and the check node threshold. The channel decoding unit 190 may reduce an amount of repeated calculations by using a result of the calculation performed when the check node calculation value is updated.

The channel decoding unit 190 may determine whether the second condition between the two conditions is met. When a syndrome bit is 0 in the check nodes included in the $k^{th}$ layer, the channel decoding unit 190 may determine that the corresponding check node meets the second condition. The syndrome bit is expressed as Sm. m corresponds to a number of the check node may indicate a particular row of the parity matrix. When a product of the particular row of the parity matrix and the input bit sequence is 0, the channel decoding unit 190 may determine that the syndrome bit of the check node corresponding to the particular row is 0.

The channel decoding unit 190 may insert at least one check node into the deactivation set. With respect to the deactivation check node included in the deactivation set, the channel decoding unit 190 may not update the check node calculation value of the corresponding check node from a next decoding operation. That is, the channel decoding unit 190 may set an $i+1^{th}$ check node calculation value to be the same as the $i^{th}$ check node calculation value. The channel decoding unit 190 may omit the calculation process for the $i+1^{th}$ check node calculation value.

The Tanner graph 300 shows the $i^{th}$ iteration decoding operation of the channel decoding unit 190. Referring to the Tanner graph 300, the channel decoding unit 190 may update check node calculation values for the second layer during the $i^{th}$ iteration decoding operation. In the channel decoding unit 190, the node 223 may update the check node calculation value 310, and the check node 224 may update the check node calculation value 320. The check node calculation value 310 may be expressed as $U_{37}^{(i)}$, and the check node calculation value 320 may be expressed as $U_{41}^{(i)}$. The channel decoding unit 190 may acquire variable node calculation values to update check node calculation values for the second layer. The channel decoding unit 190 may determine a deactivation check node through Equation (9) above based on the acquired variable node calculation values. In order to determine whether the check nodes of the second layer meet Equation (9) above, the channel decoding unit 190 may acquire information indicating a threshold for the second layer from the memory. When a minimum value between absolute values of $U_{41}^{(i-1)}$, $U_{46}^{(i-1)}$ is larger than a check node threshold $T_c^{(2)}$ for the second layer and a product of a fourth row of the parity matrix and the input bit sequence is 0, the channel decoding unit 190 may determine the check node 224 as the deactivation check node.

The Tanner graph 350 shows the $i+1^{th}$ iteration decoding operation of the channel decoding unit 190. Referring to the Tanner graph 350, the channel decoding unit 190 may determine check node calculation values for the second layer during the i+1$^{th}$ iteration decoding operation. More specifically, the channel decoding unit 190 may update the check node calculation value 360 of the check node 223. The check node calculation value 360 may be expressed as $U_{37}^{(i+1)}$. The channel decoding unit 190 may update the check node calculation value 360 based on Equation (10) below.

$$U_{37}^{(i+1)} = \prod_{n' \in N(3)\backslash 7} \text{sgn}(V_{3n'}^{(i)}) \min_{n' \in N(3)\backslash 7} |V_{3n'}^{(i)}| \qquad \text{Equation (10)}$$

The channel decoding unit 190 may determine the check node calculation value 370 of the check node 224. The check node calculation value 370 may be indicated by $U_{41}^{(i+1)}$. The check node 224 is determined as the deactivation check node during the i$^{th}$ iteration decoding operation, and the channel decoding unit 190 may not perform a separate calculation for updating the check node calculation value 370. That is, the channel decoding unit 190 may determine the check node calculation value 370 based on Equation (11) below.

$$U_{41}^{(i+1)} = U_{41}^{(i)} \qquad \text{Equation (11)}$$

The channel decoding unit 190 may omit the calculation for updating the check node calculation value by deactivating the check node. The channel decoding unit 190 may apply different thresholds to check nodes of different layers among the plurality of check nodes, so as to reflect a structure of an LDPC code with corresponding variable nodes and check nodes that vary depending on a particular layer.

The channel decoding unit 190 may deactivate the check node, and thus reduce an amount of calculations of the calculation operation for updating the variable node calculation value of the variable node connected to the deactivation check node. In order to update the variable node calculation value of the variable node, the channel decoding unit 190 may be used to acquire the check node calculation value of the check node connected to the variable node. When the check node connected to the variable node is the deactivation check node, the channel decoding unit 190 may reduce an amount of calculations for updating the variable node calculation value by using the check node calculation value in a previous iteration decoding operation.

Further, since a QC-LDPC structure corresponds to a structure in which one variable node is connected to one check node in one layer, when the channel decoding unit 190 deactivates the check node in the QC-LDPC structure, the variable node connected to the check node maintains a predetermined variable node calculation value in the layer including the check node even though an iteration decoding operation is performed. Accordingly, the channel decoding unit 190 may result in deactivating the variable node connected to the check node by determining the deactivation check node. Through the effect, the channel decoding unit 190 may acquire an effect of reducing total calculation operations.

Figure 4:
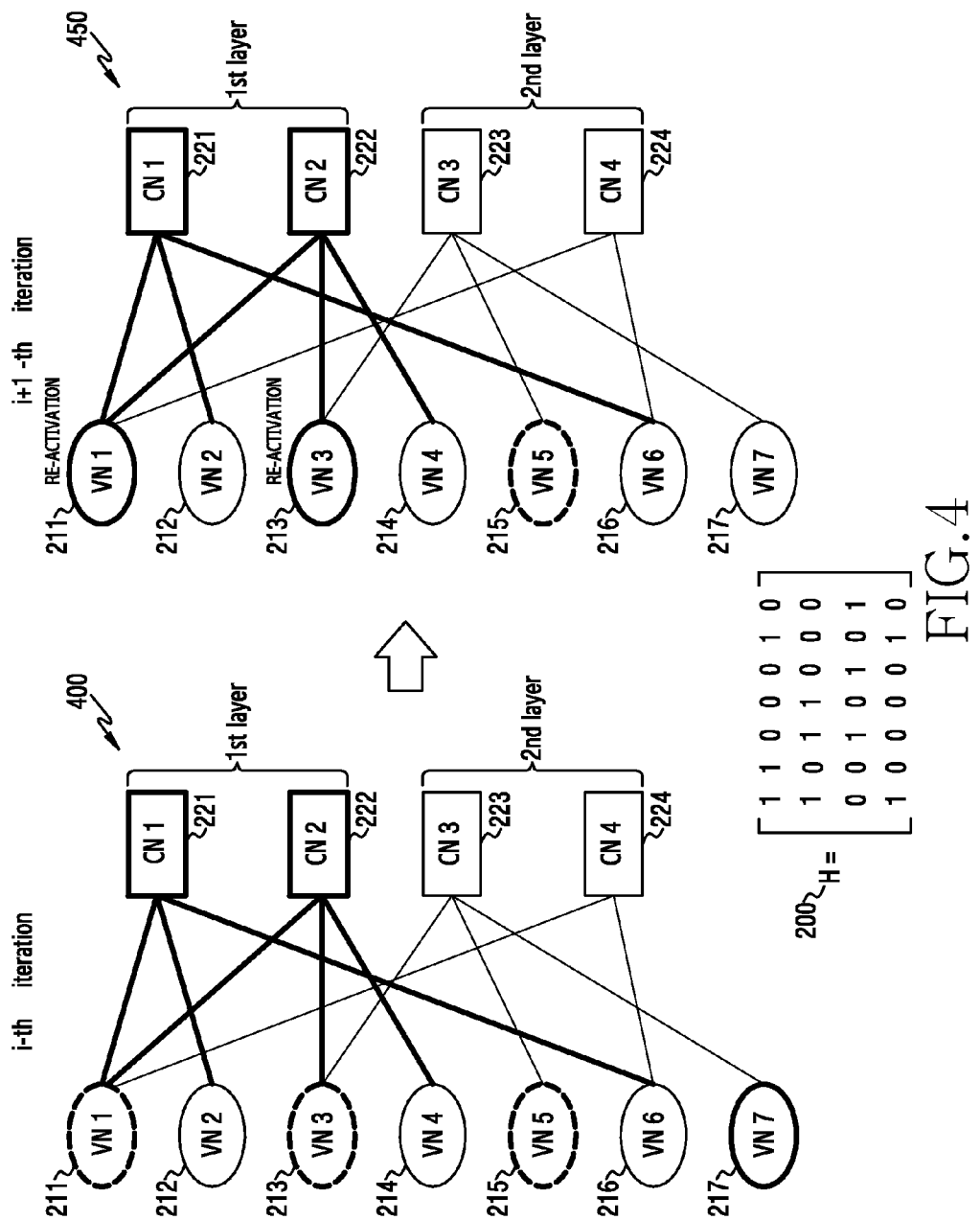
FIG. 4 illustrates an example of re-activation of variable nodes of the channel decoding unit according to various embodiments of the present disclosure.

FIG. 4 illustrates an example of re-activation of variable nodes of a channel decoding unit according to various embodiments of the present disclosure. The channel decoding unit may be the channel decoding unit 190 of FIG. 1. A situation in which the channel decoding unit 190 updates check node calculation values of a first layer during an i$^{th}$ iteration decoding operation will be described.

Referring to FIG. 4, the channel decoding unit 190 may perform the decoding by using the parity matrix 200 of FIG. 2. Accordingly, the channel decoding unit 190 may perform a decoding operation of a codeword of 7 bits consisting of an information word of 3 bits and parity bits of 4 bits through a Tanner graph 400 and a Tanner graph 450.

The channel decoding unit 190 may update check node calculation values of check nodes included in a second layer during the i$^{th}$ iteration decoding operation. More specifically, the channel decoding unit 190 may update the check node calculation values based on Equation (5) above. For example, the channel decoding unit 190 may acquire variable node calculation values $V_{11}^{(i-1)}$, $V_{12}^{(i-1)}$, $V_{16}^{(i-1)}$ from variable nodes 211, 212, and 216 connected to the check node 221 included in the first layer. The channel decoding unit 190 may acquire variable node calculation values $V_{23}^{(i-1)}$, $V_{24}^{(i-1)}$ from variable nodes 213 and 214 connected to the check node 222 included in the first layer. The channel decoding unit 190 may update check node calculation values $U_{11}^{(i)}$, $U_{12}^{(i)}$, $U_{16}^{(i)}$ of the check node 221 and check node calculation values $U_{21}^{(i)}$, $U_{23}^{(i)}$, $U_{24}^{(i)}$ of the check node 222 based on the acquired variable node calculation values.

According to various embodiments of the present disclosure, the channel decoding unit 190 may determine a variable node to be re-activated. Based on variable node calculation values acquired to update check node calculation values for a k$^{th}$ layer, the channel decoding unit 190 may determine whether to deactivate variable nodes connected to the check node included in the k$^{th}$ layer. More specifically, the channel decoding unit 190 may determine whether to re-activate the deactivation variable nodes based on the following equation.

$$\min_{n' \in N(m)} |V_{mn'}^{(i-1)}| < t_c^{(k)} \qquad \text{Equation (12)}$$

$V_{mn'}^{(i-1)}$ denotes a variable node calculation value transmitted from the n$^{th}$ variable node to the m$^{th}$ check node during the i$^{th}$ iteration decoding operation. The m$^{th}$ check node is a check node included in the k$^{th}$ layer. The variable node calculation value is an LLR value. N(m) denotes a set of variable nodes connected to the m$^{th}$ check node. $t_c^{(k)}$ denotes a re-activation threshold applied to the k$^{th}$ layer. That is, the re-activation threshold may be differently set according to a layer.

When the equation is met in the m$^{th}$ check node, the channel decoding unit 190 may exclude, among variable nodes included in a deactivation set, all the variable nodes connected to the m$^{th}$ check node from the deactivation set. Accordingly, in order to update variable node calculation value for the re-activated variable node, the channel decoding unit 190 may perform the calculation operation of Equation (6) above.

The Tanner graph 400 shows the i$^{th}$ iteration decoding operation of the channel decoding unit 190. Referring to the Tanner graph 400, the variable node 211 and the variable node 213 may be deactivation variable nodes. In order to determine variable node calculation values for the variable node 211 and the variable node 213, the channel decoding unit 190 may not perform the calculation operation of Equation (6) in which the check node calculation values are summed up.

The channel decoding unit 190 may acquire variable node calculation values in order to update the check node calculation value for the check node 222. For example, in order to update the check node calculation value $U_{21}^{(i)}$, the channel decoding unit 190 may acquire $V_{21}^{(i-1)}$, $V_{23}^{(i-1)}$, $V_{24}^{(i-1)}$. The channel decoding unit 190 may determine whether to activate all variable nodes connected to the check node 222 based on Equation (13) below. That is, the channel decoding unit 190 may determine whether to re-activate the variable nodes 211 and 213 based on Equation (13) below.

$$\min_{n' \in N(2)} |V_{2n'}^{(i-1)}| < t_c^{(1)} \qquad \text{Equation (13)}$$

$t_c^{(1)}$ denotes a re-activation threshold for the first layer. When a minimum value of absolute values of $V_{21}^{(i-1)}$, $V_{23}^{(i-1)}$, $V_{24}^{(i-1)}$ is smaller than the re-activation threshold for the first layer, the channel decoding unit 190 may re-activate the variable node 211 and the variable node 213.

The Tanner graph 450 shows the $i+1^{th}$ iteration decoding operation of the channel decoding unit 190. Referring to the Tanner graph 400, the channel decoding unit 190 may determine variable node calculation values for the first layer during the $i+1^{th}$ iteration decoding operation. The channel decoding unit 190 may update $i+1^{th}$ variable node calculation values. At this time, the channel decoding unit 190 may acquire $U_{11}^{(i+1)}$, $U_{21}^{(i+1)}$ in order to update the variable node calculation value of the re-activated variable node 211. That is, in order to determine $V_{21}^{(i+1)}$, the channel decoding unit 190 may perform the calculation operation for the following equation without applying $V_{21}^{(i)}$ as it is.

$$V_{21}^{(i+1)} = U_{n,ch}^{(0)} + \sum_{m' \in M(1) \setminus m} U_{m'1}^{(i)} \qquad \text{Equation (14)}$$

The deactivation of variable nodes may reduce an amount of calculations of the iteration decoding operation, but frequent deactivation of the variable nodes may reduce accuracy of the decoding. In contrast, when the large number of variable nodes are re-activated to increase the accuracy of the decoding, the amount of calculations may increase. Accordingly, the channel decoding unit 190 according to various embodiments of the present disclosure may minimize unnecessary re-activation of the variable nodes by applying different re-activation thresholds according to layers. By preventing unnecessary re-activation, the channel decoding unit 190 may maintain the accuracy of the decoding and also reduce the amount of calculations.

Figure 5:
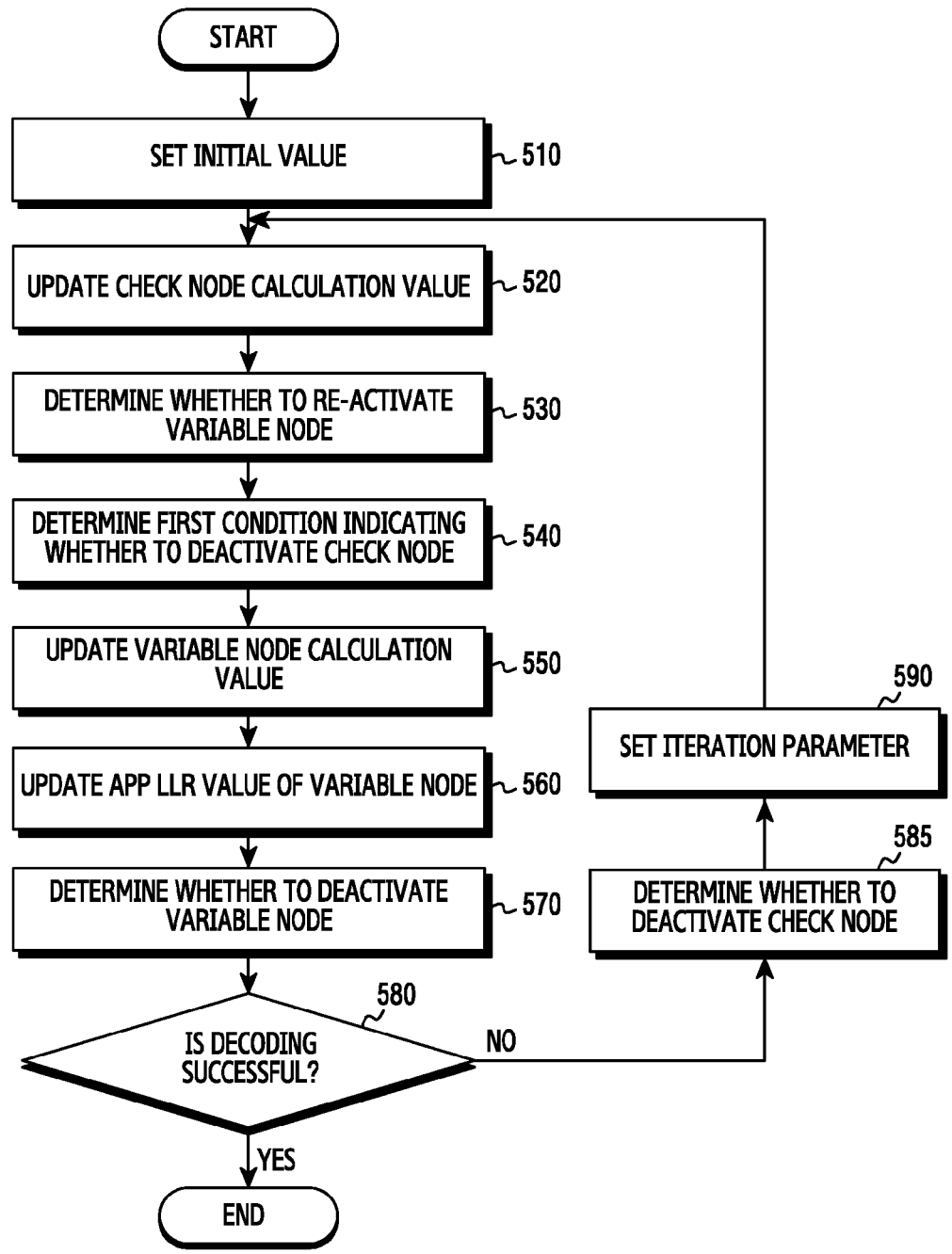
FIG. 5 is a flowchart illustrating the operation of the channel decoding unit according to various embodiments of the present disclosure.

FIG. 5 is a flowchart illustrating the operation of a channel decoding unit according to various embodiments of the present disclosure. The channel decoding unit may be the channel decoding unit 190 of FIG. 1.

In operation 510, the channel decoding unit 190 may set an initial value of each of the check node calculation value, the variable node calculation value, and the likelihood value of the variable node.

The channel decoding unit 190 may set an initial value of the variable node calculation value. The variable node calculation value may be a likelihood value transmitted from a predetermined variable node to a predetermined check node. The channel decoding unit 190 may set the initial value of the variable node calculation value to be 0. According to the order of the operation, the channel decoding unit 190 may set the initial value of the variable node calculation value of the variable node to be an initial value of an APP LLR value of the variable node.

The channel decoding unit 190 may set the initial value of the check node calculation value. The check node calculation value may be a likelihood value transmitted from a predetermined check node to a predetermined variable node. The channel decoding unit 190 may set the initial value of the check node calculation value to be 0.

The channel decoding unit 190 may set the initial value of the likelihood value of the variable node. The likelihood value of the variable node may be the APP LLR value of the variable node. The APP LLR value of the variable node may be an LLR value indicating whether a bit value corresponding to the variable node is 0 or 1. For example, when the likelihood value of the third variable node is 3.7, the channel decoding unit 190 may determine that a third bit of the bit sequence is 1. In another example, when the likelihood value of the second variable node is −2.1, the channel decoding unit 190 may determine that a second bit of the bit sequence is 0.

The channel decoding unit 190 may perform a first iteration decoding operation based on the determined initial values. When performing one iteration decoding operation, the channel decoding unit 190 may perform the decoding in the unit of layers. For example, when performing a third iteration decoding operation, the channel decoding unit 190 may repeatedly perform operations 520 to 590 for the first layer, and operations 520 to 590 for the second layer. When operations 520 to 590 are performed for the last layer, the channel decoding unit 190 may perform the decoding operation for the first layer during a fourth iteration decoding operation corresponding to the next iteration decoding operation. Hereinafter, a situation in which the check node calculation value for the $k^{th}$ layer is updated during the $i^{th}$ iteration decoding operation will be described.

In operation 520, the channel decoding unit 190 may update check node calculation values. The channel decoding unit 190 may update check node calculation values for check nodes included in the $k^{th}$ layer during the $i^{th}$ iteration decoding operation. In order to update the check node calculation values, the channel decoding unit 190 may use $i-1^{th}$ updated variable node calculation values.

In operation 530, the channel decoding unit 190 may determine whether a first condition indicating whether to deactivate the check node is met. The first condition corresponds to Equation (9) above. In order to determine whether the first condition is met, the channel decoding unit 190 may identify an index of the layer including the check node. The channel decoding unit 190 may acquire a check node threshold according to the index from the memory. The memory may be a memory included in the reception device 160. The memory may store a threshold for each of the layers. For example, when the number of layers of the stored parity matrix is 3, the memory may store three thresholds. The channel decoding unit 190 may compare the check node calculation value updated for the check node and the check node threshold. When the check node calculation value is larger than the check node threshold, the channel decoding unit 190 may determine that the first condition for deactivation of the check node is met.

The channel decoding unit 190 may determine whether to deactivate the check node by using the $i-1^{th}$ updated variable node calculation values acquired through the calculation of operation 520. That is, by performing operation 530 immediately after operation 520, the channel decoding unit 190 may omit the calculation for the $i-1^{th}$ updated variable node calculation value that is the calculation used for determining whether to deactivate the check node. The omission of the operation may reduce power consumption.

In operation 540, the channel decoding unit 190 may determine whether to re-activate the variable node. In order to determine whether to re-activate the variable node, the channel decoding unit 190 may identify an index of the layer on which the decoding operation is being performed. The variable node may be a variable node connected to the check node included in the layer. The channel decoding unit 190 may acquire a re-activation threshold according to the index of the layer from the memory. The channel decoding unit 190 may compare the check node calculation value updated for the check node and the re-activation threshold. When the check node calculation value is smaller than the variable node threshold, the channel decoding unit 190 may activate all the variable nodes connected to the check node.

The channel decoding unit 190 may determine whether to re-activate the variable node by using the i−1$^{th}$ updated variable node calculation values acquired through the calculation of operation 520. That is, by performing operation 540 immediately after operation 520, the channel decoding unit 190 may omit the calculation for the i−1$^{th}$ updated variable node calculation value that is the calculation used for determining whether to re-activate the variable node.

Although it is illustrated that operation 540 is performed after operation 530 in FIG. 5, it is only an example for description. Unlike FIG. 5, operation 530 and operation 540 may be performed simultaneously or in reverse order.

In operation 550, the channel decoding unit 190 may update the variable node calculation value. The channel decoding unit 190 may update variable node calculation values for variable nodes connected to the check nodes included in the k$^{th}$ layer during the i$^{th}$ iteration decoding operation. In order to update the variable node calculation values, the channel decoding unit 190 may use i$^{th}$ updated variable node calculation values.

In operation 560, the channel decoding unit 190 may update a likelihood value of the variable node. The likelihood value of the variable node may refer to an APP LLR value of a bit corresponding to the variable node. The channel decoding unit 190 may update a likelihood value of the variable node included in variable nodes corresponding to the k$^{th}$ layer during the i$^{th}$ iteration decoding operation. The variable nodes corresponding to the k$^{th}$ layer are variable nodes connected to check nodes included in the k$^{th}$ layer. In order to update the likelihood value, the channel decoding unit 190 may use i$^{th}$ updated check node calculation values.

Although it has been described that operation 580 is performed after operation 570, it is only an example for description. Unlike FIG. 5, operation 570 and operation 580 may be performed simultaneously or in reverse order.

In operation 570, the channel decoding unit 190 may determine whether to deactivate the variable node. The channel decoding unit 190 may determine whether to deactivate the variable node included in variable nodes corresponding to the k$^{th}$ layer. The channel decoding unit 190 may determine a degree of the variable node. For example, when the number of check nodes connected to the variable node is 3, the channel decoding unit 190 may determine that the degree of the variable node is 3. The channel decoding unit 190 may acquire a variable node threshold according to the degree of the variable node from the memory. The memory may store a threshold for each degree. For example, when degrees of the variable node of the stored parity matrix includes a first degree, a second degree, and a tertiary degree, the memory may store three thresholds. The channel decoding unit 190 may compare the likelihood value of the variable node updated in operation 560 and the variable node threshold according to the degree of the variable node. When the likelihood value of the variable node is larger than the variable node threshold, the channel decoding unit 190 may deactivate the variable node.

In operation 580, the channel decoding unit 190 may determine whether the decoding operation is successful.

The channel decoding unit 190 may decode the bit sequence input into the channel decoding unit 190 according to the likelihood value of the variable node updated in operation 560. For example, when the bit sequence input for the codeword corresponds to a bit sequence of 7 bits and the likelihood value of the variable node updated in operation 560 corresponds to {1.3, 3.2, −2.1, −2.3, −33.2, −13.4, 0.7}, the channel decoding unit 190 may determine that a decoding bit sequence is {1, 1, 0, 0, 0, 0, 1}. The decoding bit sequence is a bit sequence updated according to the repetition of the iteration decoding operation.

The channel decoding unit 190 may determine whether the decoding bit sequence meets a decoding success condition. In order to determine the decoding success condition, the channel decoding unit 190 may use the parity matrix stored in the memory. More specifically, the channel decoding unit 190 may determine whether the decoding bit sequence meets Equation (2) above. In other words, the channel decoding unit 190 may determine whether a syndrome bit for each check node is 0.

When the decoding bit sequence meets the decoding success condition, the channel decoding unit 190 may end the total decoding operation. The channel decoding unit 190 may determine that the decoding bit sequence is the received codeword. The channel decoding unit 190 may output the determined codeword. When the decoding bit sequence does not meet the decoding success condition, the channel decoding unit 190 may perform operation 585.

In operation 585, the channel decoding unit 190 may determine whether to deactivate the check node. When the check node does not meet the first condition in operation 540, the channel decoding unit 190 may maintain the check node in an active state. Thereafter, the channel decoding unit 190 may perform operation 590. When the check node meets the first condition in operation 540, the channel decoding unit 190 may determine whether the check node meets a second condition.

When the syndrome bit of the check node is 0, the channel decoding unit 190 may determine that the second condition is met. The channel decoding unit 190 may determine whether the syndrome bit of the check node is 0 by using a result of operation 580. When the check node meets the first condition in operation 540 and the syndrome bit of the check node is 0, the channel decoding unit 190 may deactivate the check node. For example, when the syndrome bit for the third check node is 0 and the third check node meets Equation (9), the channel decoding unit 190 may deactivate the check node. Thereafter, the channel decoding unit 190 may perform operation 590.

When the syndrome bit of the check node is not 0, the channel decoding unit 190 may maintain the check node in an active state. Thereafter, the channel decoding unit 190 may perform operation 590.

In operation 590, the channel decoding unit 190 may set an iteration parameter. The iteration parameter may be a layer number or a number of times the iteration decoding operation is performed.

The channel decoding unit 190 may set a layer on which the decoding is performed. For example, when the decoding operation for the first layer is performed during a fourth iteration decoding operation, the channel decoding unit 190 may change a number of a layer on which the next iteration operation is performed into a number of the second layer.

Thereafter, the channel decoding unit 190 may perform the decoding for the second layer in the fourth iteration decoding operation.

The channel decoding unit 190 may set a number of times the iteration decoding operation is performed. The $i^{th}$ iteration decoding operation may refer to repetition of an operation of updating variable node calculation values, check node calculation values, likelihood values of variable nodes for all layers i times. For example, when the decoding operation is performed for the last layer during the fourth iteration decoding operation, the channel decoding unit 190 may set the number of iteration decoding operations to be 5. Thereafter, the channel decoding unit 190 may perform the decoding for the first layer in the fifth iteration decoding operation.

Although it has been described with respect to the operation of the channel decoding unit 190 in FIGS. 2 to 5 that the channel decoding unit 190 sequentially updates the check node calculation values, the variable node calculation values, and then the likelihood values of the variable nodes in one iteration decoding operation, the present disclosure is not limited thereto. That is, the order of the operations may be changed in one iteration decoding operation.

The variable node threshold, the check node threshold, or the re-activate threshold according to various embodiments may be adaptively determined according to a parity matrix used for the encoding and the decoding of the LDPC code. In order to determine the thresholds, various schemes may be used. For example, a Multi-Edge Type (MET) density evolution scheme may be used to determine accurate thresholds. In another example, an RAC-Density Evolution scheme may be used. In another example, a Protograph EXIT (PEXIT) chart scheme may be used to reduce complexity. Hereinafter, although the PEXIT chart scheme will be described as an example of a method of determining the thresholds, various embodiments of the present disclosure are not limited thereto.

In the following description, an electronic device performs the PEXIT chart scheme. In some embodiments, the electronic device may be configured as hardware separated from the reception device 160 of FIG. 1. In other embodiments, the electronic device may be configured as one hardware with the reception device 160 of FIG. 1.

According to various embodiments, the electronic device may determine thresholds based on Mutual Information (MI). The electronic device may determine a Base matrix (B) from the parity matrix. The base matrix is a matrix that briefly expresses a variable node and a check node with a similar characteristic in the parity matrix. The parity matrix may have M variable node groups and N check node groups. The electronic device may determine thresholds based on mutual information on each element of the base matrix. A detailed operation for determining the mutual information to determine the thresholds will be described below.

The electronic device may receive a signal through a channel. The electronic device may determine mutual information for the channel based on the received signal. More specifically, the electronic device may determine the mutual information for the channel based on the following equation.

$$I_{ch}=J(\sigma_{ch})=J(\sqrt{8R \cdot SNR_{th}}) \qquad \text{Equation (15)}$$

$I_{ch}$ denotes mutual information for a channel. $SNR_{th}$ denotes a threshold of a Signal-to-Noise Ratio (SNR) used in the LDPC code, and R denotes a code rate of a signal. $J(\sigma_{ch})$ denotes a function for mutual information between a binary random variable X in which probabilities of 0 and 1 are the same and a Gaussian random variable in which the mean is X and the variance is $\sigma_{ch}^2$.

The electronic device may determine Check Node Mutual Information (CN MI) which the check node transmits to the variable node based on mutual information for the channel and Variable Node Mutual Information (VN MI) received from variable nodes connected to the check node as shown in Equation (16) below. At this time, the electronic device may set $I_{V2C}^{(0)}(i,j)$ to be $I_{ch}$ which is the mutual information for the channel. $I_{V2C}^{(0)}(i,j)$ denotes mutual information of a likelihood value which is transmitted from variable nodes included in a $j^{th}$ row to check nodes included in an $i^{th}$ row in the base matrix B when an initial iteration decoding operation is performed.

$$I_{C2V}^{(l)}(i,j) = 1 - J\left(\sqrt{\sum_{\substack{s \neq j \\ s=0}}^{N-1} b_{i,s}[J^{-1}(1 - I_{V2C}^{(l-1)}(i,s))]^2}\right) \qquad \text{Equation (16)}$$

$I_{C2V}^{(l)}((i,j)$ denotes mutual information of a likelihood value which is transmitted from check nodes included in the $i^{th}$ row to variable nodes included in the $j^{th}$ row in the base matrix B when an $l^{th}$ iteration decoding operation is performed. The mutual information may be referred to as check node mutual information. $b_{i,s}$ denotes an element corresponding to an $i^{th}$ row and an $s^{th}$ column in the base matrix B. l denotes a number of repetitions of the iteration decoding operation. N denotes the number of columns of the base matrix B. That is, N indicates the number of variable node groups.

The electronic device may determine variable node mutual information based on the check node mutual information determined based on Equation (16) above. More specifically, the electronic device may determine the variable node mutual information based on the following equation.

$$I_{V2C}^{(l)}(i,j) = J\left(\sqrt{\sum_{\substack{s \neq i \\ s=0}}^{M-1} b_{s,j}[J^{-1}(I_{C2V}^{(l)}(s,j))]^2 + [J^{-1}(I_{ch})]^2}\right) \qquad \text{Equation (17)}$$

$I_{V2C}^{(l)}(i,j)$ denotes mutual information of a likelihood value which is transmitted from variable nodes included in the $j^{th}$ row to check nodes included in the $i^{th}$ row in the base matrix B when the $l^{th}$ iteration decoding operation is performed. The mutual information may be referred to as variable node mutual information. M denote the number of rows of the base matrix B. That is, M indicates the number of check node groups.

The electronic device may determine APP mutual information (APP MI) of the variable node based on the variable node mutual information determined based on Equation (17) above. More specifically, the electronic device may determine the APP mutual information of the variable node based on Equation (18) below. The variable node may be a variable node included in the $j^{th}$ column of the base matrix B.

$$I_{APP}^{(l)}(j) = J\left(\sqrt{\sum_{s=0}^{M-1} b_{s,j}[J^{-1}(I_{C2V}^{(l)}(s,j))]^2 + [J^{-1}(I_{ch})]^2}\right) \qquad \text{Equation (18)}$$

$l_{APP}^{(l)}(j)$ denotes mutual information likelihood values of variable nodes included in the j row of the base matrix B when the $l^{th}$ iteration decoding operation is performed. The likelihood value may be the APP LLR value. The mutual information may be referred to as APP mutual information.

Figure 6:
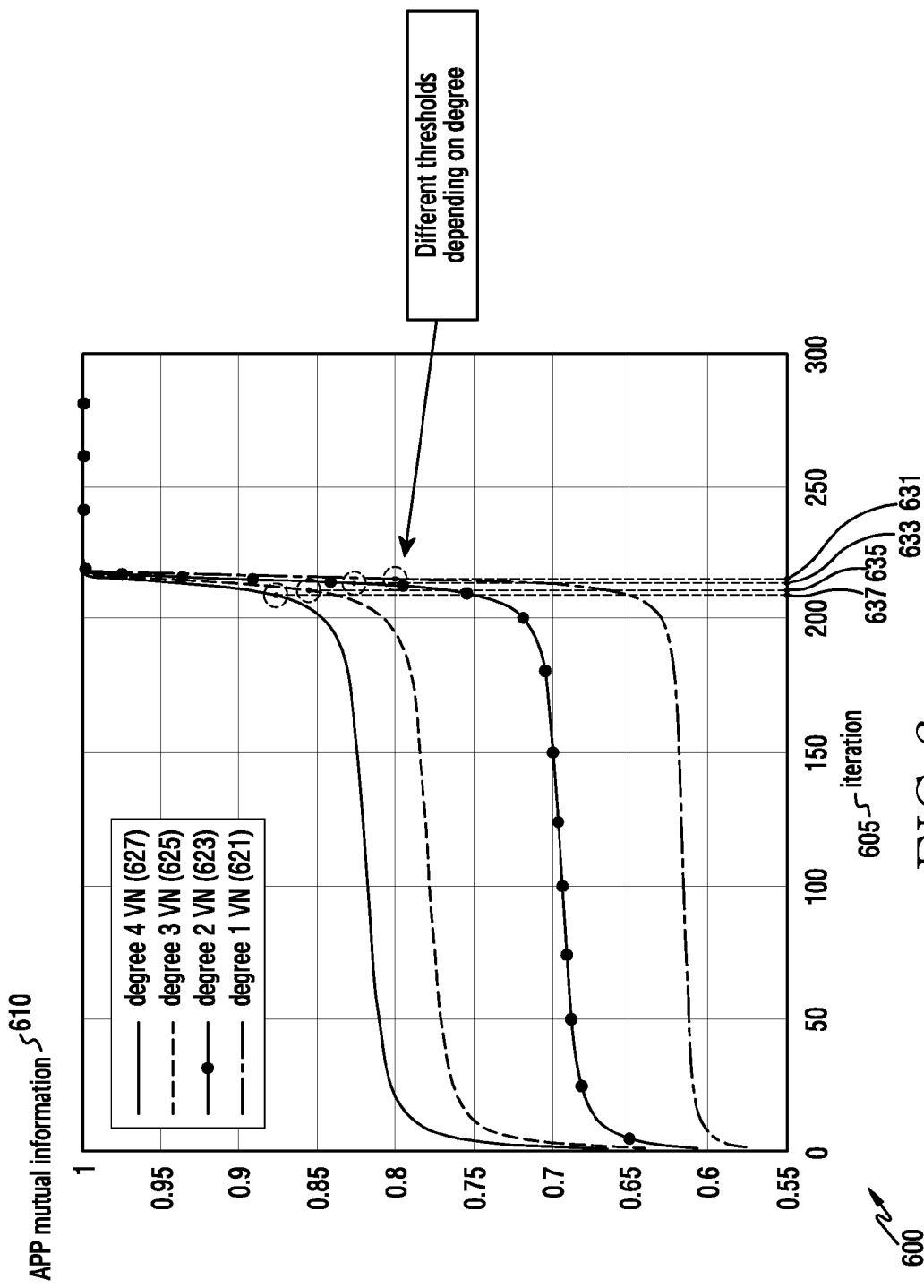
FIG. 6 illustrates an example of determination of a variable node threshold according to various embodiments of the present disclosure.
Figure 7:
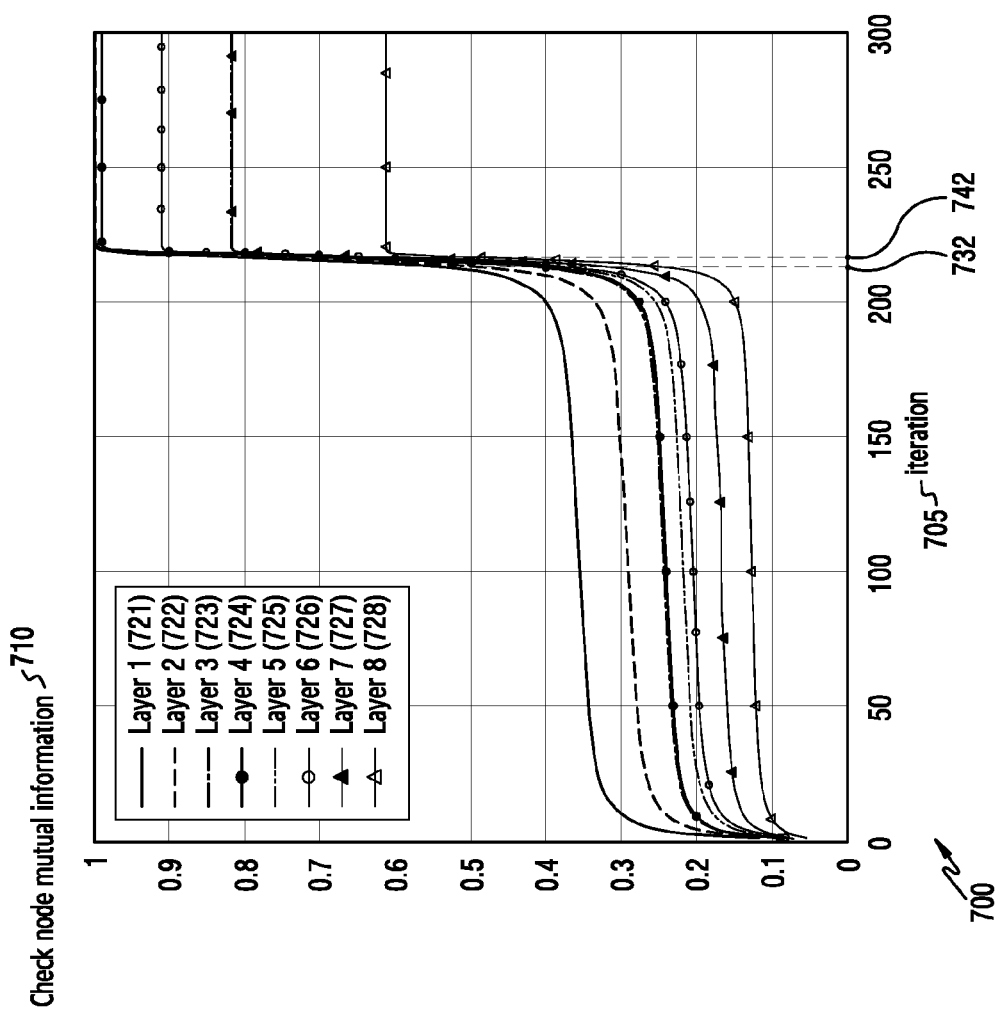
FIG. 7 illustrates an example of determination of a check node threshold and a re-activation threshold according to various embodiments of the present disclosure.
Figure 8:
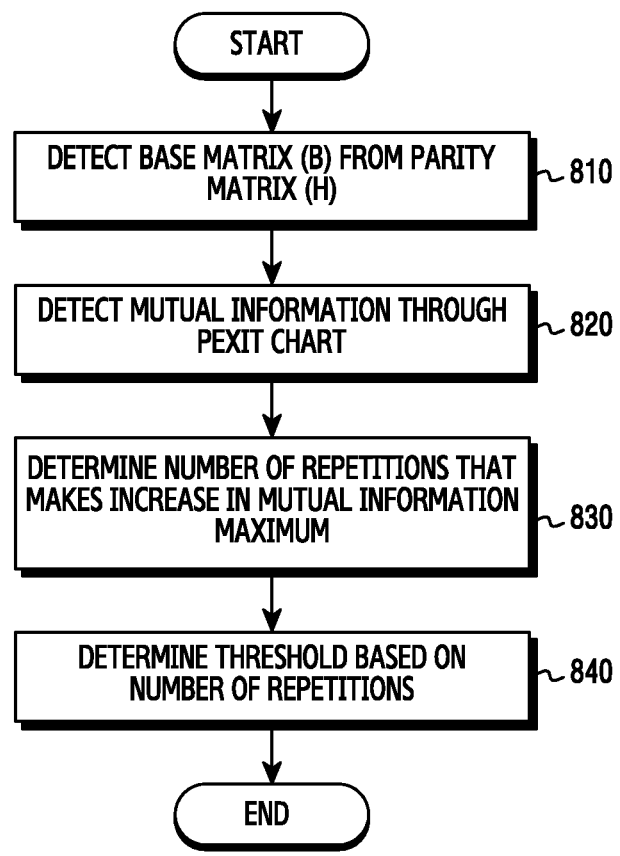
FIG. 8 is a flowchart illustrating the operation for determining threshold information according to various embodiments of the present disclosure.

Hereinafter, FIGS. 6 to 8 illustrate a scheme for determining the variable node threshold, the check node threshold, or the re-activation threshold based on the check node mutual information, the variable node mutual information, and the APP mutual information determined through the above scheme.

FIG. 6 illustrates an example of determination of the variable node threshold according to various embodiments of the present disclosure.

Referring to FIG. 6, a graph 600 shows APP mutual information according to a number of repetitions of the iteration decoding operation. In the graph 600, a horizontal axis 605 indicates a number of repetitions and a vertical axis 610 indicates APP mutual information. The graph 600 includes a line 621 corresponding to 1 of the degree of the variable node, a line 623 corresponding to 2 of the degree of the variable node, a line 625 corresponding to 3 of the degree of the variable node, and a line 627 corresponding to 4 of the degree of the variable node. The lines 621 to 627 are determined based on Equation (18) above. For example, the line 621 corresponds to the mean of APP mutual information of all variable nodes with the degree of 1. In another example, the line 627 corresponds to the mean of APP mutual information of all variable nodes with the degree of 4. As the degree of the variable node becomes different, the electronic device may use another variable node threshold when a variable node deactivation operation is performed.

According to various embodiment of the present disclosure, the electronic device may determine the variable node threshold according to a relation between the APP mutual information and the number of repetitions, and the degree of the variable node. More specifically, the electronic device may determine the variable node threshold based on Equations (19) and (20) below.

$$l^*_{v,deg(n)} = \max_{l(later)} \left\{ \frac{d}{dl} l_{APP}^{deg(n)}(l) \right\} \quad \text{Equation (19)}$$

$l_{APP}^{deg(n)}(l)$ denotes the mean of APP mutual information for variable nodes with a degree of an $n^{th}$ variable node in the $l^{th}$ iteration decoding operation. $l^*_{v,deg}(n)$ denotes a number of repetitions that makes a change of $l_{APP}^{deg(n)}(l)$ for the number of repetitions of the iteration decoding operation maximum. The number of repetitions may be an integer number. The number of repetitions may be referred to as a first threshold repetition number.

The first threshold repetition number may be a rounded up value of the number of repetitions that makes the slope of the tangent maximum in each of the lines included in the graph 600. For example, when the number of repetitions that makes the slope of the tangent maximum is 231.7, the electronic device may determine that the first threshold repetition number is 232. Referring to the graph 600, the electronic device may determine that the first threshold repetition number for the first degree is a number of repetitions 631. The electronic device may determine that the first threshold repetition number for the second degree is a number of repetitions 633. The electronic device may determine that the first threshold repetition number for the tertiary degree is a number of repetitions 635. The electronic device may determine that the first threshold repetition number for the quaternary degree is a number of repetitions 637. That is, the electronic device may determine different first threshold repetition numbers depending on the degree.

The electronic device may determine the variable node threshold based on the following equation after determining the first threshold repetition number $l^*_{v,deg}(n)$.

$$t_v^{deg(n)} = \frac{1}{2}[J^{-1}(l_{APP}^{deg(n)}(l^*_{v,deg(n)}))]^2 \quad \text{Equation (20)}$$

$t_v^{deg(n)}$ (denotes a variable node threshold for a degree of an $n^{th}$ variable node.

The electronic device may determine a variable node threshold for each of the degrees of the variable nodes in the parity matrix. The electronic device may store the determined variable node thresholds in the memory.

FIG. 7 illustrates an example of determination of the check node threshold and the re-activation threshold according to various embodiments of the present disclosure.

Referring to FIG. 7, a graph 700 shows check node mutual information for a number of repetitions of the iteration decoding operation. In the graph 700, a horizontal axis 705 indicates a number of repetitions and a vertical axis indicates check node mutual information. The graph 700 includes a line 721 corresponding to layer 1, a line 722 corresponding to layer 2, a line 723 corresponding to layer 3, a line 724 corresponding to layer 4, a line 725 corresponding to layer 5, a line 726 corresponding to layer 6, a line 727 corresponding to layer 7, and a line 728 corresponding to layer 8. The lines 721 to 728 are determined based on Equation (16) above. For example, the line 722 corresponds to the mean of check node mutual information of all check nodes included in layer 2. In another example, the line 727 corresponds to the mean of check node mutual information of all check nodes included in layer 7. As the layer including the check becomes different, the electronic device may use different check node thresholds or different re-activation thresholds when a check node de-activation operation or a variable node re-activation operation is performed.

According to various embodiments, the electronic device may determine the check node threshold according to a relation between the check node mutual information and the number of repetitions, and the layer. More specifically, the electronic device may determine the check node threshold based on Equations (21) and (22) below.

$$l^\dagger_{c,k} = \max_{l(later)} \left\{ \frac{d}{dl} l_{C2V}^{(k)}(l) \right\} \quad \text{Equation (21)}$$

$l_{C2V}^{(k)}(l)$ denotes the mean of check node mutual information of check nodes included in the $k^{th}$ layer during the $l^{th}$ iteration decoding operation. $l_{c,k}^\dagger$ denotes a number of repetitions that makes a change of $l_{C2V}^{(k)}(l)$ for the number of repetitions of the iteration decoding operation maximum. The number of repetitions may be an integer number. The number of repetitions may be referred to as a second threshold repetition number.

The second threshold repetition number may be a rounded up value of the number of repetitions that makes the slope of the tangent maximum in each of the lines included in the graph 700. For example, when the number of repetitions that makes the slope of the tangent maximum is 333.2, the electronic device may determine that the second threshold repetition number is 334. Referring to graph 700, the electronic device may determine that the second threshold repetition number for a second layer is a number of repetitions 742.

The electronic device may determine the check node threshold based on the following equation after determining $l_{c,k}^\dagger$.

$$T_c^{(k)} = \tfrac{1}{2}[J^{-1}(l_{C2V}^{(k)}(l_{c,k}^\dagger))]^2 \qquad \text{Equation (22)}$$

$T_c^{(k)}$ denotes a check node threshold for a check node included in the $k^{th}$ layer.

According to various embodiments of the present disclosure, the electronic device may determine the re-activation threshold according to a relation between check node mutual information and the number of repetitions, and the layer. More specifically, the electronic device may determine the re-activation threshold based on Equations (23) and (24) below.

$$l_{c,k}^* + 1 = \max_{l(later)}\left\{\frac{d}{dl} l_{C2V}^{(k)}(l)\right\} \qquad \text{Equation (23)}$$

$l_{C2V}^{(k)}(l)$ denotes the mean of check node mutual information of check nodes included in the $k^{th}$ layer during the $l^{th}$ iteration decoding operation. $1^*_{c,k}+1$ denotes a number of repetitions that makes a change of $l_{C2V}^{(k)}(l)$ for the number of repetitions of the iteration decoding operation maximum. The number of repetitions may be an integer number. $1^*_{c,k}$ may be a value generated by subtracting 1 from $1^*_{c,k}+1$. $1^*_{c,k}$ may be referred to as a third threshold repetition number.

The third threshold repetition number may be a rounded down value of the number of repetitions that makes the slope of the tangent maximum in each of the lines included in the graph 700. For example, when the number of repetitions that makes the slope of the tangent maximum is 547.1, the electronic device may determine that the third threshold repetition number is 547. Referring to graph 700, the electronic device may determine that the third threshold repetition number for a second layer is a number of repetitions 732.

The electronic device may determine the re-activate threshold based on the following equation after determining $1^*_{c,k}$.

$$t_c^{(k)} = \tfrac{1}{2}[J^{-1}(l_{C2V}^{(k)}(1^*_{c,k}))]^2 \qquad \text{Equation (24)}$$

$t_c^{(k)}$ denotes a re-activation threshold for re-activating variable nodes connected to the check node included in the $k^{th}$ layer.

The electronic device may determine variable check node thresholds and re-activation thresholds corresponding to the number of layers that separate the parity matrix. The electronic device may store the determined check node thresholds and re-activation thresholds in the memory.

FIG. 8 is a flowchart illustrating the operation for determining threshold information according to various embodiments of the present disclosure. The threshold information may include information on the variable node threshold of FIG. 6, and the check node threshold and the re-activation threshold of FIG. 7.

Referring to FIG. 8, the electronic device may detect a base matrix from the parity matrix in operation 810. The parity matrix may be a parity matrix set for the encoding of the transmission device 110 and the decoding operation of the reception device 160. The base matrix is a matrix detected based on the parity matrix. For example, the electronic device may detect the base matrix by using a unit matrix included in the parity matrix, a zero matrix, and a shifting factor in the unit matrix. In some embodiments, the electronic device may express a matrix of 42×42 dimensions included in the parity matrix through one element within the base matrix.

In operation 820, the electronic device may detect mutual information based on the PEXIT chart. The electronic device may determine check node mutual information, variable node mutual information, and APP mutual information based on the base matrix detected in operation 810. More specifically, the electronic device may determine the check node mutual information, the variable node mutual information, and the APP mutual information through Equations (16) to (18). The electronic device may detect the mean of the APP mutual information according to a number of repetitions and a degree of the variable node through the PEXIT chart. Further, the electronic device may also detect the mean of the check node mutual information according to the number of repetitions and a layer index of the check node through the PEXIT chart.

In operation 830, the electronic device may determine the number of repetitions that makes a change of the mutual information maximum. The electronic device may determine the number of repetitions that makes a change in the mean of the APP mutual information maximum. The number of repetitions may be a first threshold repetition number. More specifically, the electronic device may determine the first threshold repetition number based on Equation (19) above.

Further, the electronic device may determine the number of repetitions that makes a change in the mean of the check node mutual information maximum. The number of repetitions may be a second threshold repetition number. More specifically, the electronic device may determine the second threshold repetition number based on Equation (21) above.

Further, the electronic device may determine a third threshold repetition number from the number of repetitions that makes the change in the mean of the check node mutual information maximum. More specifically, the electronic device may determine the third threshold repetition number based on Equation (23) above.

In operation 840, the electronic device may determine threshold information based on the determined number of repetitions. The threshold information may be information indicating variable node thresholds according to a degree, check node thresholds according to a layer, and re-activation node thresholds according to a layer.

The electronic device may determine the variable node threshold according to the first threshold repetition number. More specifically, the electronic device may determine the variable node threshold based on Equation (20). The variable node threshold may be differently determined depending on the degree of the variable node.

The electronic device may determine the check node threshold according to the second threshold repetition number. More specifically, the electronic device may determine the check node threshold based on Equation (22). The check node threshold may be differently determined depending on the layer including the check node.

The electronic device may determine the re-activation threshold according to the third threshold repetition number. More specifically, the electronic device may determine the re-activation threshold based on Equation (24). The re-activation threshold may be differently determined depending on the layer corresponding to the check node connected to the variable node.

The electronic device may store the determined thresholds in the memory. The thresholds may be used for the calculation of the channel decoding unit 190 of FIG. 1. In some embodiments, the memory may be configured as hardware separated from the reception device 160 of FIG. 1. The memory may be included in the reception device 160.

Figure 9:
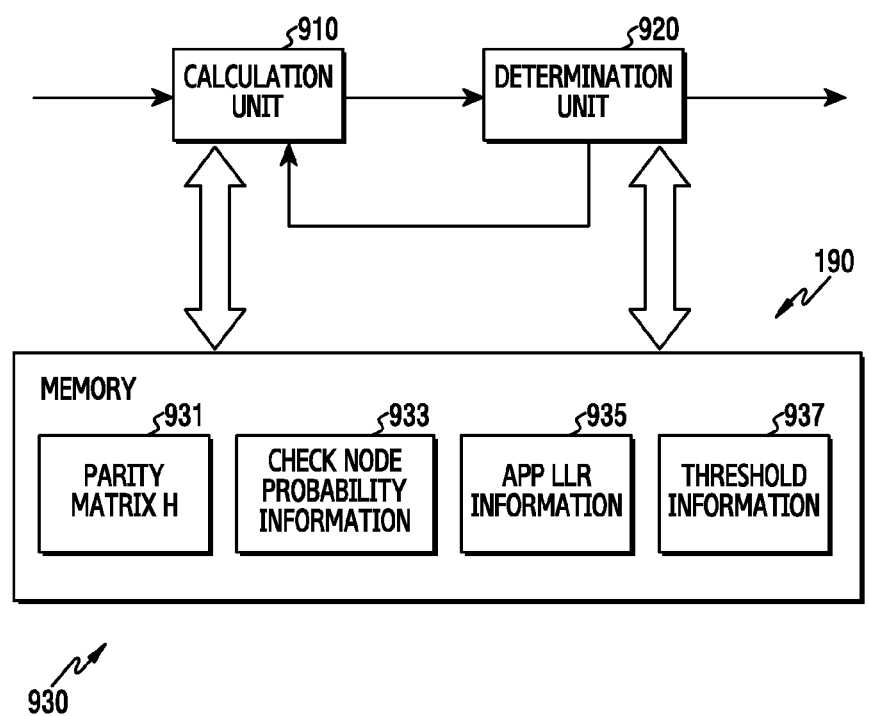
FIG. 9 illustrates an example of a functional configuration of the channel decoding unit according to various embodiments of the present disclosure.

FIG. 9 illustrates an example of a functional configuration of the channel decoding unit according to various embodiments of the present disclosure. The channel decoding unit may be the channel decoding unit 190 of FIG. 1.

Referring to FIG. 9, the channel decoding unit 190 may include an calculation unit 910 and a determination unit 920. In some embodiments, the memory 930 may be included in the channel decoding unit 190. In other embodiments, the memory 930 may be another hardware element within the reception device 160. In other embodiments, the memory 930 may be a hardware device separated from the reception device 160. Hereinafter, it is described that the memory 930 is hardware separated from the channel decoding unit 190, the present disclosure is not limited thereto.

The calculation unit 910 may set an initial value. For example, the calculation unit 910 may set an initial value of the check node calculation value, an initial value of the variable node calculation value, and an initial value of the likelihood value of the variable node.

The calculation unit 910 may update the check node calculation value. The calculation unit 910 may acquire variable node calculation values in order to update the check node calculation value.

The calculation unit 910 may determine whether a first condition indicating whether to deactivate the check node is met based on the acquired variable node calculation values. When the check node calculation value is updated, the calculation unit 910 may avoid duplicate calculations by acquiring the variable node calculation values. When the first condition is met, the calculation unit 910 may determine whether a second condition is met by determining whether a syndrome bit of the check node is 0. When the check node is deactivated, the calculation unit 910 may omit the update of the check node. Accordingly, when updating the check node calculation value during the $i+1^{th}$ iteration decoding operation, the calculation unit 910 may use the check node calculation value updated when the $i^{th}$ iteration decoding operation is performed. In this case, the calculation unit 910 may update the check node calculation value by using check node calculation value information 933 stored in the memory 930.

The calculation unit 910 may determine whether to re-activate the variable node based on the acquired variable node calculation values. In order to update the check node calculation value of the check node, the calculation unit 910 may omit the calculation used for determining whether to re-activate the variable nodes connected to the check node by acquiring the variable node calculation values. The calculation unit 910 may determine whether to re-activate the variable node based on Equation (12) above. The calculation unit 910 may apply different check node thresholds according to the layer including the check node. When determining whether to re-activate the variable node, the calculation unit 910 may determine which layer includes the check node. The calculation unit 910 may acquire the check node threshold for the layer including the check node from the memory 930. The calculation unit 910 may determine whether to activate all variable nodes connected to the check node based on the acquired check node threshold. The calculation unit 910 may re-activate the variable node that has been deactivated during the previous iteration decoding operation. The calculation unit 910 may maintain active states of variable nodes that have not been deactivated during the previous iteration decoding operation. The calculation unit 910 may minimize unnecessary re-activation by applying different thresholds according to the layer.

The calculation unit 910 may update the variable node calculation value. The calculation unit 910 may acquire check node calculation values in order to update the variable node calculation value.

The calculation unit 910 may update a likelihood value of the variable node based on the acquired check node calculation values. The likelihood value may be the APP LLR value. The calculation unit 910 may determine whether to deactivate the variable node based on the updated APP LLR value of the variable node. The calculation unit 910 may determine at least one variable node to be deactivated among a plurality of variable nodes of the parity matrix. The calculation unit 910 may reduce an amount of calculations by deactivating at least one variable node. Further, the calculation unit 910 may optimally acquire an effect of reducing the amount of calculations for a variable node with a low degree by applying different variable node thresholds according to the degree of the variable node.

The calculation unit 910 may determine a bit sequence according to the updated likelihood value of the variable node. The calculation unit 910 may transmit the determined bit sequence to the determination unit 920 so that the determination unit 920 determines whether the determined sequence bit corresponds to the codeword transmitted from the transmission device.

The determination unit 920 may determine whether the bit sequence meets a decoding success condition. The decoding success condition may be Equation (2) above. The determination unit 920 may use the parity matrix stored in the memory 930 in order to determine whether the decoding success condition is met. The determination unit 920 may determine whether a syndrome bit corresponding to each check node of the parity matrix is 0. When syndrome bits of all check nodes are 0, the determination unit 920 may determine that the bit sequence meets the decoding success condition.

When the bit sequence meets the decoding success condition, the determination unit 920 may end the decoding operation for the bit sequence. When the bit sequence does not meet the decoding success condition, the determination unit 920 may control the calculation unit 910 to update the likelihood value for the bit sequence again.

The memory 930 may store information used for the decoding calculation.

The memory 930 may store the parity matrix 931. The parity matrix 931 may be a preset parity matrix. The parity matrix 931 may be a matrix determined through negotiation with the transmission device. The parity matrix 931 may be a matrix shared with the transmission device. The parity matrix 931 may be a parity matrix for a generation matrix of the codeword transmitted from the transmission device. The parity matrix 931 may be used for setting the check node, the variable node, and the edge by the calculation unit 910. Further, the parity matrix 931 may be used for determining whether the decoding success condition is met by the determination unit 920.

The memory 930 may include check node calculation value information 933. The calculation unit 910 may acquire check node calculation values when updating the variable node calculation value. At this time, the memory 930 may store the acquired check node calculation values as the check node calculation value information 933. When the calculation unit 910 updates the variable node calculation value or performs another calculation operation, the memory 930 may output the check node calculation value information 933.

Although FIG. 9 illustrates that variable node calculation value information is not stored, it is only an example. Unlike FIG. 9, the memory 930 may store the variable node calculation value information. The information stored in the memory 930 may be differently determined depending on the order of calculations by the calculation unit 910.

The memory 930 may include APP LLR information 935. The memory 930 may store the updated likelihood value of the variable node, that is, the APP LLR value. The APP LLR information 935 may be the APP LLR value stored whenever the APP LLR is updated such as the iteration decoding operation or the decoding operation for the layer.

The memory 930 may include threshold information 937. The threshold information 937 may include a variable node threshold for determining whether to deactivate the variable node according to a degree of the variable node. In a case of a WiGig LDPC code defined in IEEE 802.11ad, a quantization level may be 8 bits. The threshold is determined based on the size, and does not require a code bit. Accordingly, a value indicating the threshold may be expressed by 7 bits. For example, when the number of degrees of the variable nodes of the parity matrix is 4, 28 bits may be used to store variable node thresholds.

The threshold information 937 may include a check node threshold for determining whether to deactivate the check node according to a layer of the check node. The threshold information 937 may include a re-activation value for determining whether to activate variable nodes connected to the check node according to a layer of the check node. For example, when the number of layers included in the parity matrix is 8, 56 bits may be used for the WiGig LDPC code to store the check node threshold. When the re-activation threshold is stored, 56 bits may be also used. Accordingly, in order to store the check node threshold and the variable node threshold, a total of 112 bits may be used.

FIG. 10 is a graph illustrating an effect of a structural decoding scheme according to various embodiments of the present disclosure. The structural decoding scheme is a decoding scheme of the LDPC code. The LDPC code may be a QC-LDPC code. The structural decoding scheme may be a scheme for reflecting a structure of the parity matrix of the QC-LDPC to perform the decoding.

Figure 10A:
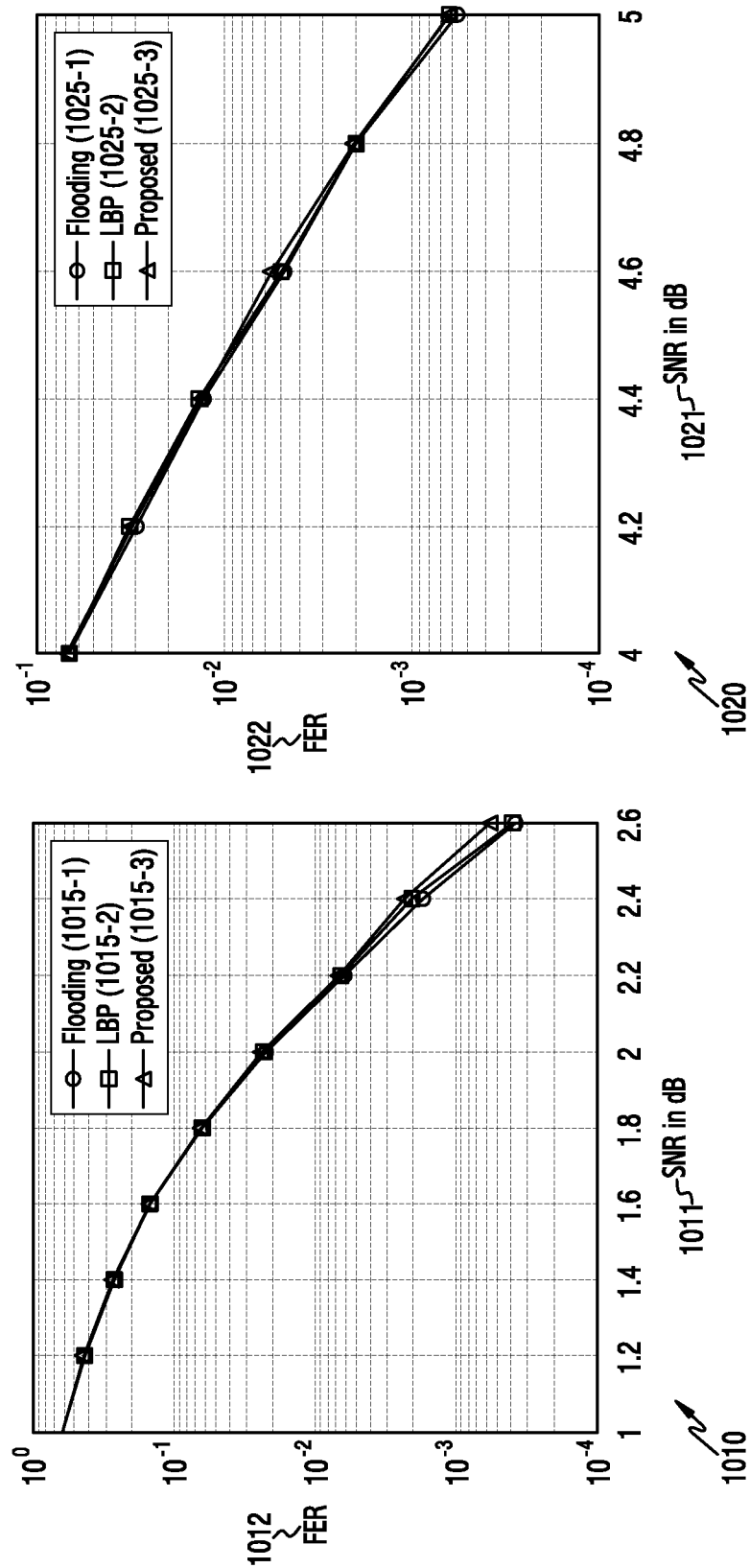
FIG. 10A illustrates graphs showing the performance of a structural decoding scheme according to various embodiments of the present disclosure.

FIG. 10A illustrates graphs showing the performance of the structural decoding scheme according to various embodiments of the present disclosure. In FIG. 10A, it is illustrated that the structural decoding scheme has no performance deterioration compared to the conventional decoding scheme of the LDPC code. A flooding scheme and a normal LBP decoding scheme are used as the conventional decoding scheme of the LDPC code. A simulation environment of the graphs illustrated in FIG. 10A corresponds to an LDPC code environment of WiGig in which a length of the codeword is 672 bits and a used modulation scheme is BPSK. A code rate is ½.

Referring to FIG. 10A, a graph 1010 shows a Frame Error Rate (FER) according to signal quality in an AWGN channel. The signal quality may be an SNR. In the graph 1010, a horizontal axis 1011 indicates the SNR and a vertical axis 1012 indicates the frame error rate. The graph 1010 includes a line 1015-1 corresponding to the flooding scheme, a line 1015-2 corresponding to the normal LBP decoding scheme, and a line 1015-3 corresponding to the structural decoding scheme according to various embodiments of the present disclosure.

Referring to the graph 1010, it may be noted that there is little difference between the line 1015-3 and the other lines 1015-1 and 1015-2. That is, the structural decoding scheme has little performance deterioration in the AWGN channel compared to the other decoding schemes.

A graph 1020 shows a frame error rate according to signal quality in a fading channel. The signal quality may be an SNR. In the graph 1020, a horizontal axis 1021 indicates the SNR and a vertical axis 1022 indicates the frame error rate. The graph 1020 includes a line 1025-1 corresponding to the flooding scheme, a line 1025-2 corresponding to the normal LBP decoding scheme, and a line 1025-3 corresponding to the structural decoding scheme according to various embodiments of the present disclosure.

Referring to the graph 1020, it may be noted that there is little difference between the line 1025-3 and the other lines 1025-1 and 1025-2. That is, the structural decoding scheme has extremely low performance deterioration in the fading channel compared to the other decoding schemes.

Figure 10B:
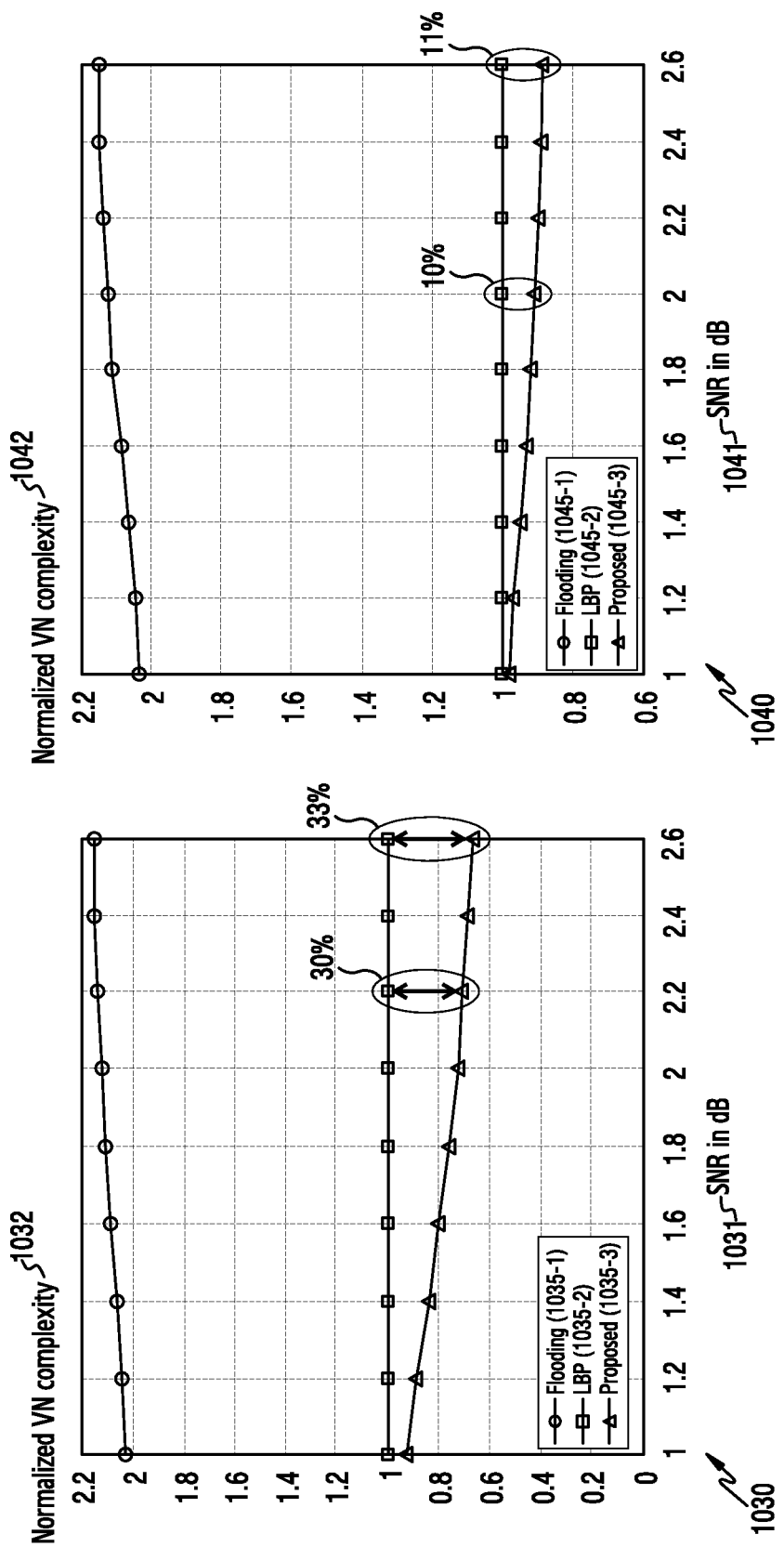
FIG. 10B illustrates other graphs showing the performance of the structural decoding scheme according to various embodiments of the present disclosure.

FIG. 10B illustrates other graphs showing the performance of the structural decoding scheme according to various embodiments of the present disclosure. In FIG. 10B, it is illustrated that the structural decoding scheme has an effect of reducing an amount of calculations in the AWGN channel compared to the conventional decoding scheme of the LDPC code. A flooding scheme and a normal LBP decoding scheme are used as the conventional decoding scheme of the LDPC code. A simulation environment of the graphs illustrated in FIG. 10B corresponds to an LDPC code environment of WiGig in which a length of the codeword is 672 bits and a used modulation scheme is BPSK. A code rate is ½.

Referring to FIG. 10B, a graph 1030 shows an amount of calculations in the variable node according to signal quality in the AWGN channel. The signal quality may be an SNR. The graph 1030 shows amounts of calculations of the variable node according to other schemes when it is assumed that the amount of calculations of the variable node is 1 in the normal LBP decoding scheme. In the graph 1030, a horizontal axis 1031 indicates the SNR and a vertical axis 1032 indicates the amount of calculations in the variable node. The graph 1030 includes a line 1035-1 corresponding to the flooding scheme, a line 1035-2 corresponding to the normal LBP decoding scheme, and a line 1035-3 corresponding to the structural decoding scheme according to various embodiments of the present disclosure. Referring to the graph 1030, when the SNR is 2.2 dB, the structural decoding scheme may reduce the amount of calculations of the variable node by 30% compared to the normal LBP decoding scheme. When the SNR is 2.4 dB, the structural decoding scheme may reduce the amount of calculations of the variable node by 33% compared to the normal LBP decoding scheme.

A graph 1040 shows an amount of calculations in the check node according to the SNR in the AWGN channel. The graph 1040 shows amounts of calculations of the check node according to other schemes when it is assumed that the amount of calculations of the check node is 1 in the normal LBP decoding scheme. In the graph 1040, a horizontal axis 1041 indicates the SNR and a vertical axis 1042 indicates the amount of calculations in the variable node. The graph 1040 includes a line 1045-1 corresponding to the flooding scheme, a line 1045-2 corresponding to the normal LBP decoding scheme, and a line 1045-3 corresponding to the structural decoding scheme according to various embodiments of the present disclosure. Referring to the graph 1040, when the SNR is 2.2 dB, the structural decoding scheme may reduce the amount of calculations of the check node by 10% compared to the normal LBP decoding scheme. When the SNR is 2.4 dB, the structural decoding scheme may reduce the amount of calculations of the check node by 11% compared to the normal LBP decoding scheme.

Figure 10C:
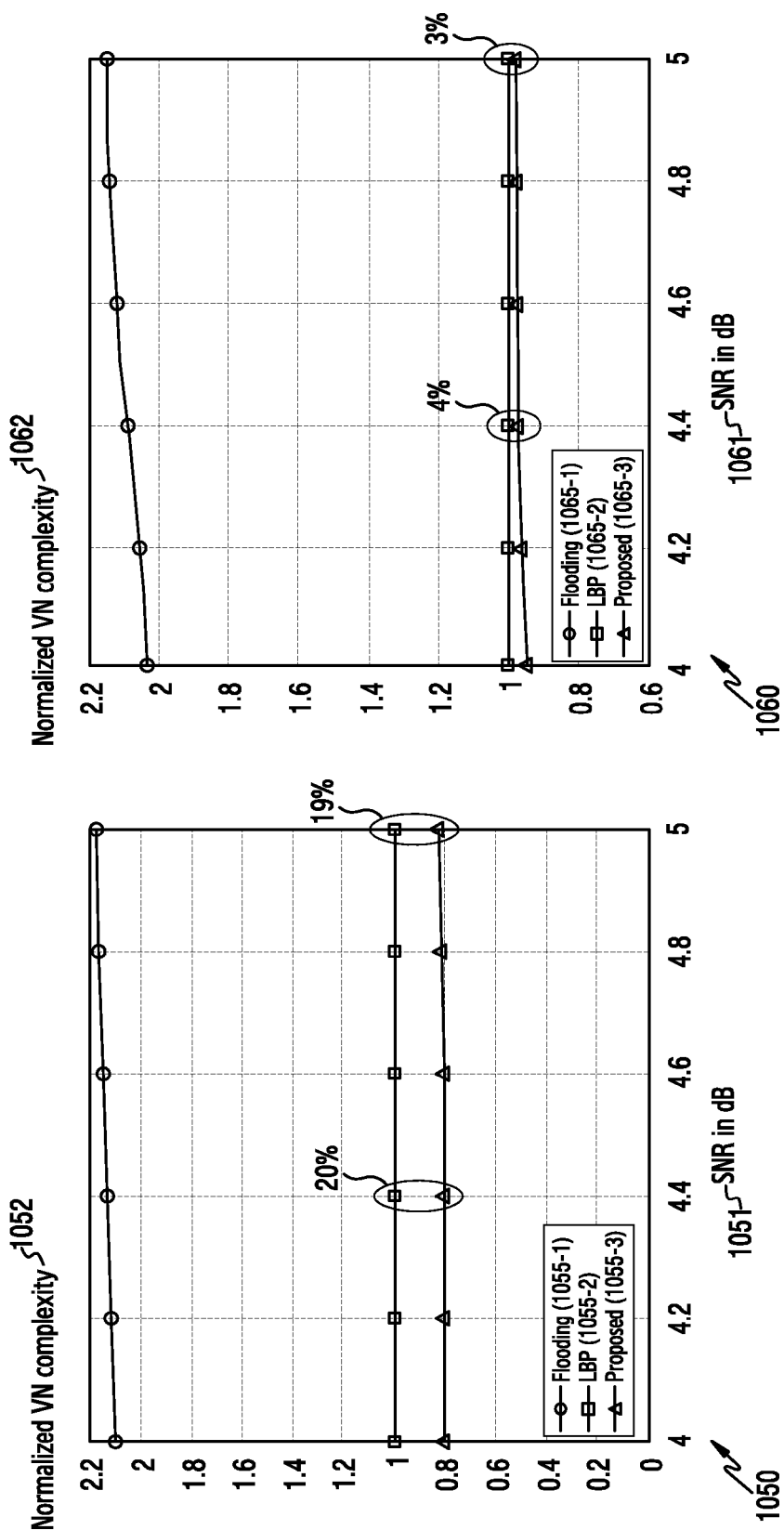
FIG. 10C illustrates other graphs showing the performance of the structural decoding scheme according to various embodiments of the present disclosure.

FIG. 10C illustrates other graphs showing the performance of the structural decoding scheme according to various embodiments of the present disclosure. In FIG. 10C, it is illustrated that the structural decoding scheme has an effect of reducing an amount of calculations in the fading channel compared to the conventional decoding scheme of the LDPC code. A flooding scheme and a normal LBP decoding scheme are used as the conventional decoding scheme of the LDPC code. A simulation environment of the graphs illustrated in FIG. 10C corresponds to an LDPC code environment of WiGig in which a length of the codeword is 672 bits and a used modulation scheme is BPSK. A code rate is ½.

Referring to FIG. 10C, a graph 1050 shows an amount of calculations in the variable node according to an SNR of a signal in a fading channel. The graph 1050 shows amounts of calculations of the variable node according to other schemes when it is assumed that the amount of calculations of the variable node is 1 in the normal LBP decoding scheme. In the graph 1050, a horizontal axis 1051 indicates the SNR and a vertical axis 1052 indicates the amount of calculations in the variable node. The graph 1050 includes a line 1055-1 corresponding to the flooding scheme, a line 1055-2 corresponding to the normal LBP decoding scheme, and a line 1055-3 corresponding to the structural decoding scheme according to various embodiments of the present disclosure. Referring to the graph 1050, when the SNR is 4.4 dB, the structural decoding scheme may reduce the amount of calculations of the variable node by 20% compared to the normal LBP decoding scheme. When the SNR is 5 dB, the structural decoding scheme may reduce the amount of calculations of the variable node by 19% compared to the normal LBP decoding scheme.

A graph 1060 shows an amount of calculations in the check node according to the SNR of the signal in the fading channel. The graph 1060 shows amounts of calculations of the check node according to other schemes when it is assumed that the amount of calculations of the check node is 1 in the normal LBP decoding scheme. In the graph 1060, a horizontal axis 1061 indicates the SNR and a vertical axis 1062 indicates complexity in the variable node. The graph 1060 includes a line 1065-1 corresponding to the flooding scheme, a line 1065-2 corresponding to the normal LBP decoding scheme, and a line 1065-3 corresponding to the structural decoding scheme according to various embodiments of the present disclosure. Referring to the graph 1060, when the SNR is 4.4 dB, the structural decoding scheme may reduce the amount of calculations of the check node by 4% compared to the normal LBP decoding scheme. When the SNR is 5 dB, the structural decoding scheme may reduce the amount of calculations of the check node by 3% compared to the normal LBP decoding scheme.

Figure 10D:
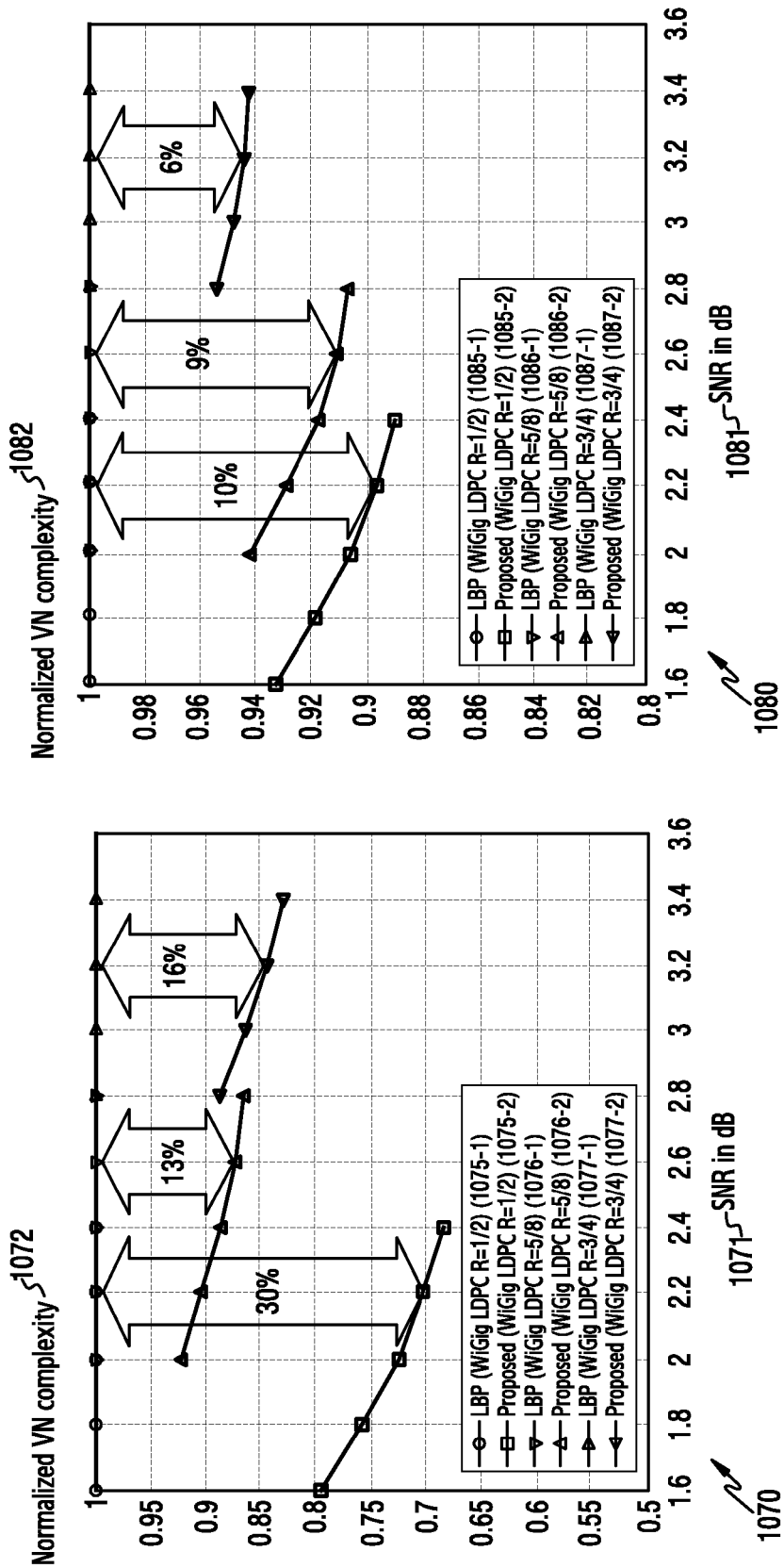
FIG. 10D illustrates other graphs showing the performance of the structural decoding scheme according to various embodiments of the present disclosure.

FIG. 10D illustrates other graphs showing the performance of the structural decoding scheme according to various embodiments of the present disclosure. In FIG. 10D, it is illustrated that the structure decoding scheme has an effect of reducing an amount of calculations in various code rates compared to the normal LBP decoding scheme. A simulation environment of the graphs illustrated in FIG. 10D corresponds to an LDPC code environment of WiGig in which a length of the codeword is 672 bits and a used modulation scheme is BPSK.

Referring to FIG. 10D, a graph 1070 shows an amount of calculations in the variable node according to an SNR of a signal in an AWGN channel. The graph 1070 shows amounts of calculations of the variable node according to other schemes when it is assumed that the amount of calculations of the variable node is 1 in the normal LBP decoding scheme. In the graph 1070, a horizontal axis 1071 indicates the SNR and a vertical axis 1072 indicates the amount of calculations in the variable node. The graph 1070 includes a line 1075-1 corresponding to the normal LBP decoding scheme and a line 1075-2 corresponding to the structure scheme when the code rate is ½, a line 1076-1 corresponding to the normal LBP decoding scheme and a line 1076-2 corresponding to the structural decoding scheme when the code rate is ⅝, and a line 1077-1 corresponding to the normal LBP decoding scheme and a line 1077-2 corresponding to the structural decoding scheme when the code rate is ¾. Referring to the graph 1070, the structural decoding scheme may acquire an effect of further reducing the amount of calculations in the variable node than the normal LBP decoding scheme even though the code rate is differently set.

A graph 1080 shows an amount of calculations in the check node according to the SNR in the AWGN channel. The graph 1080 shows amounts of calculations of the check node according to other schemes when it is assumed that the amount of calculations of the check node is 1 in the normal LBP decoding scheme. In the graph 1080, a horizontal axis 1081 indicates the SNR and a vertical axis 1082 indicate the amount of calculations in the check node. The graph 1080 includes a line 1085-1 corresponding to the normal LBP decoding scheme and a line 1085-2 corresponding to the structure scheme when the code rate is ½, a line 1086-1 corresponding to the normal LBP decoding scheme and a line 1086-2 corresponding to the structural decoding scheme when the code rate is ⅝, and a line 1087-1 corresponding to the normal LBP decoding scheme and a line 1087-2 corresponding to the structural decoding scheme when the code rate is ¾. Referring to the graph 1080, the structural decoding scheme may acquire an effect of further reducing the amount of calculations in the check node than the normal LBP decoding scheme even though the code rate is differently set.

While the present disclosure has been shown and described with reference to certain embodiments thereof, it will be understood by those skilled in the art that various changes in form and details may be made therein without departing from the scope of the present disclosure. Therefore, the scope of the present disclosure should not be defined as being limited to the embodiments, but should be defined by the appended claims and equivalents thereof.

The embodiments disclosed in the present specifications and drawings are provided merely to readily describe and to help a thorough understanding of the present disclosure but are not intended to limit the scope of the present disclosure. Therefore, it should be construed that, in addition to the embodiments disclosed herein, all modifications and changes or modified and changed forms derived from the technical idea of the present disclosure fall within the scope of the present disclosure.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method of operating an electronic device for performing an iteration decoding scheme for a low density parity check (LDPC) code, the method comprising:
receiving, from another electronic device, a signal encoded according to the LDPC code; and
obtaining a decoding result of the signal based on a parity check matrix according to the LDPC code, wherein the obtaining of the decoding result comprises:
determining a degree of a variable node of the parity check matrix, wherein the degree indicates a number of check nodes connected to the variable node;
determining a threshold according to a value of the degree;
deactivating the variable node upon determining that a magnitude of a likelihood value of the variable node is greater than the threshold;
updating likelihood values of other variable nodes different from the deactivated variable node; and
obtaining the decoding result based on the likelihood value of the deactivated variable node and the updated likelihood values.

2. The method of claim 1, wherein the obtaining of the decoding result comprises:
updating at least one $i^{th}$ variable node calculation value transmitted from first variable nodes corresponding to a first layer of the parity check matrix to first check nodes included in the first layer based on at least one determined variable node;
updating at least one $i^{th}$ check node calculation value transmitted from the first check nodes to the first variable nodes based on the at least one updated $i^{th}$ variable node calculation value;
updating a $z^{th}$ likelihood value of each of a plurality of variable nodes based on the at least one updated $i^{th}$ check node calculation value; and
obtaining the decoding result based on the updated likelihood value,
wherein a variable node calculation value of the deactivated variable node is maintained as an $i-1^{th}$ updated variable node calculation value.

3. The method of claim 2, wherein the obtaining of the decoding result comprises:
deactivating a check node of the first check nodes based on a check node threshold for the first layer and each of an $i^{th}$ updated variable node calculation value of the first check nodes,
wherein a check node calculation value for the deactivated check node is maintained as an $i^{th}$ updated check node calculation value of the deactivated check node.

4. The method of claim 3, wherein the check node threshold corresponding to the first layer is determined based on a change in mutual information (MI) transmitted from the first check nodes to the first variable nodes in respect to a number of repetitions.

5. The method of claim 2, wherein the obtaining of the decoding result further comprises:
re-activating the deactivated variable node based on the $i^{th}$ updated variable node calculation value and an activation threshold for the first layer; and
updating a variable node calculation value for the re-activated variable node based on an $i+1^{th}$ updated check node calculation value in an $i+1^{th}$ iteration decoding.

6. The method of claim 5, wherein the activation threshold for the first layer is determined based on a change of mutual information (MI) transmitted from the first check nodes to the first variable nodes in respect to a number of repetitions.

7. The method of claim 2, wherein the obtaining of the decoding result further comprises:
updating at least one $i^{th}$ variable node calculation value transmitted from second variable nodes corresponding to a second layer of the parity check matrix to second check nodes included in the second layer based on the at least one determined variable node;
updating at least one $i^{th}$ check node calculation value transmitted from the second check nodes to the second variable nodes based on the at least one updated $i^{th}$ variable node calculation value;
updating a $z+1^{th}$ likelihood value of each of the plurality of variable nodes based on the updated $i^{th}$ check node calculation value; and
obtaining the decoding result based on the updated likelihood value.

8. The method of claim 1, wherein the threshold is determined based on a change in a mean of mutual information (MI) of variable nodes in respect to a number of repetitions, and
wherein each degree of the variable nodes is the value of the degree.

9. The method of claim 1, wherein the threshold is identified according to the value of the degree, among a plurality of thresholds determined based on a photograph extrinsic information transfer chart (PEXIT) chart scheme,
wherein the value of the degree is a first value, the threshold corresponds to a first threshold, and
wherein the value of the degree is a second value greater than the first value, the threshold corresponds to a second threshold that is greater than the threshold.

10. The method of claim 1, further comprising:
obtaining information word from the decoding result upon identifying that the decoding result is a success,
wherein the signal corresponds to a codeword comprising the information word and at least one parity bit, the at least one parity bit is determined by a matrix associated with the parity check matrix,
wherein the LDPC code comprises quasi-cycle (QC)-LDPC code,
wherein the iteration decoding scheme comprises a layered belief propagation (BP) decoding scheme, and
wherein the likelihood value of the variable node is a posteriori probability log-likelihood ratio (APP LLR).

11. An electronic device for performing an iteration decoding scheme for a low density parity check (LDPC) code, the electronic device comprising:
at least one transceiver configured to receive, from another electronic device, a signal encoded according to the LDPC code; and
at least one processor configured to obtain a decoding result of the signal based on a parity check matrix according to the LDPC code, wherein the at least one processor, to obtain the decoding result, is configured to:
determine a degree of a variable node of the parity check matrix, wherein the degree indicates a number of check nodes connected to the variable node;
determine a threshold according to a value of the degree;
deactivate the variable node upon determining that a magnitude of a likelihood value of the variable node is greater than the threshold;

update likelihood values of other variable nodes different from the deactivated variable node; and obtain the decoding result based on the likelihood value of the deactivated variable node and the updated likelihood values.

12. The electronic device of claim 11, wherein, in order to obtain the decoding result, the at least one processor is further configured to:

update at least one $i^{th}$ variable node calculation value transmitted from first variable nodes corresponding to a first layer of the parity check matrix to first check nodes included in the first layer based on at least one determined variable node;

update at least one $i^{th}$ check node calculation value transmitted from the first check nodes to the first variable nodes based on the at least one updated $i^{th}$ variable node calculation value;

update a $z^{th}$ likelihood value of each of a plurality of variable nodes based on the at least one updated $i^{th}$ check node calculation value; and obtain the decoding result based on the updated likelihood value, wherein the first variable nodes comprises the deactivated variable node, and wherein a variable node calculation value of the deactivated variable node is maintained as an $i-1^{th}$ updated variable node calculation value.

13. The electronic device of claim 12, wherein, in order to obtain the decoding result, the at least one processor is further configured to:

deactivate a check node based on a check node threshold for the first layer and each of an $i^{th}$ updated variable node calculation value of the first check nodes, wherein a check node calculation value for the deactivated check node is maintained as an $i^{th}$ updated check node calculation value of the deactivated check node.

14. The electronic device of claim 13, wherein the check node threshold corresponding to the first layer is determined based on a change in mutual information (MI) transmitted from the first check nodes to the first variable nodes in respect to a number of repetitions.

15. The electronic device of claim 12, wherein, in order to obtain the decoding result, the at least one processor is further configured to:

re-activate the deactivated variable node based on the $i^{th}$ updated variable node calculation value and an activation threshold for the first layer; and update an $i+1^{th}$ variable node calculation value for the re-activated variable node based on an $i+1^{th}$ updated check node calculation value in an $i+1^{th}$ iteration decoding.

16. The electronic device of claim 15, wherein the activation threshold for the first layer is determined based on a change of mutual information (MI) transmitted from the first check nodes to the first variable nodes in respect to a number of repetitions.

17. The electronic device of claim 12, wherein, in order to obtain the decoding result, the at least one processor is further configured to:

update at least one $i^{th}$ variable node calculation value transmitted from each of second variable nodes corresponding to a second layer of the parity check matrix to second check nodes included in the second layer based on the at least one determined variable node;

update at least one $i^{th}$ check node calculation value transmitted from the second check nodes to the second variable nodes based on the at least one updated $i^{th}$ variable node calculation value;

update a $z+1^{th}$ likelihood value of each of the plurality of variable nodes based on the updated $i^{th}$ check node calculation value; and obtain the decoding result based on the updated likelihood value.

18. The electronic device of claim 11, wherein the threshold is determined based on a change in a mean of mutual information (MI) of variable nodes in respect to a number of repetitions, and wherein each degree of the variable nodes is the value of the degree.

19. The electronic device of claim 11, wherein the threshold is identified according to the value of the degree, among a plurality of thresholds determined based on a photograph extrinsic information transfer chart (PEXIT) chart scheme, wherein the value of the degree is a first value, the threshold corresponds to a first threshold, and wherein the value of the degree is a second value greater than the first value, the threshold corresponds to a second threshold that is greater than the threshold.

20. The electronic device of claim 11, wherein the at least one processor is further configured to:

obtain information word from the decoding result upon identifying that the decoding result is a success, wherein the signal corresponds to a codeword comprising the information word and at least one parity bit, the at least one parity bit is determined by a matrix associated with the parity check matrix, wherein the LDPC code comprises quasi-cycle (QC)-LDPC code, wherein the iteration decoding scheme comprises a layered belief propagation (BP) decoding scheme, and wherein the likelihood value of the variable node is a posteriori probability log-likelihood ratio (APP LLR).

* * * * *